(12) United States Patent
Kawamura

(10) Patent No.: US 10,033,345 B2
(45) Date of Patent: Jul. 24, 2018

(54) NOISE FILTER

(71) Applicant: Mitsubishi Electric Corporation, Tokyo (JP)

(72) Inventor: Mao Kawamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 55 days.

(21) Appl. No.: 14/912,424

(22) PCT Filed: Oct. 17, 2013

(86) PCT No.: PCT/JP2013/078154
§ 371 (c)(1),
(2) Date: Feb. 17, 2016

(87) PCT Pub. No.: WO2015/056321
PCT Pub. Date: Apr. 23, 2015

(65) Prior Publication Data
US 2016/0204754 A1    Jul. 14, 2016

(51) Int. Cl.
*H03H 7/01* (2006.01)
*H03H 1/00* (2006.01)
*H03H 7/42* (2006.01)
*H02M 1/12* (2006.01)

(52) U.S. Cl.
CPC .......... *H03H 1/0007* (2013.01); *H02M 1/126* (2013.01); *H03H 1/00* (2013.01);
(Continued)

(58) Field of Classification Search
CPC .... H03H 7/427; H03H 1/0007; H03H 7/0115; H03H 2001/0085
(Continued)

(56) References Cited

U.S. PATENT DOCUMENTS 2,984,802 A * 5/1961 Dyer John N .......... H01P 3/085
                                                      333/134
3,571,722 A * 3/1971 Vendelin .................. H01P 5/10
                                                      333/25
(Continued)

FOREIGN PATENT DOCUMENTS

CN            1340877 A       3/2002
CN          102027661 A       4/2011
(Continued)

OTHER PUBLICATIONS

Communication dated Nov. 1, 2016, from the Japanese Patent Office in counterpart application No. 2015-542448.
(Continued)

*Primary Examiner* — Rakesh Patel
(74) *Attorney, Agent, or Firm* — Sughrue Mion, PLLC; Richard C. Turner

(57) ABSTRACT

A noise filter inserted between the power source side and the load side of a main circuit for which noise is reduced to attenuate noise of the main circuit using a filter circuit including the coil and the capacitor. In the noise filter, the board ground pattern is separated into a plurality of board ground patterns, the separated board ground patterns are connected to a common ground member present outside the board, the separated board ground patterns are formed as solid patterns, and adjacent board ground patterns of the separated board ground patterns are disposed so as to have a spacing equal to or less than a predetermined distance.

9 Claims, 19 Drawing Sheets

(52) U.S. Cl.
CPC .......... *H03H 7/0115* (2013.01); *H03H 7/427* (2013.01); *H03H 2001/0035* (2013.01); *H03H 2001/0085* (2013.01)

(58) Field of Classification Search
USPC ........................................ 333/185, 175, 181
See application file for complete search history.

(56) References Cited

U.S. PATENT DOCUMENTS

| | | | | |
|---|---|---|---|---|
| 4,426,630 | A | * | 1/1984 | Folkmann .............. H03H 11/04 333/110 |
| 2002/0101303 | A1 | | 8/2002 | Tojyo |
| 2006/0274472 | A1 | | 12/2006 | Saito et al. |
| 2007/0241839 | A1 | * | 10/2007 | Taniguchi ................ H03H 7/09 333/185 |
| 2008/0063092 | A1 | | 3/2008 | Takahashi |
| 2010/0214041 | A1 | * | 8/2010 | Cho .................... H01L 23/5225 333/238 |
| 2013/0063913 | A1 | | 3/2013 | Yoshida et al. |

FOREIGN PATENT DOCUMENTS

| | | |
|---|---|---|
| EP | 1696559 A1 | 8/2006 |
| EP | 2 278 694 A1 | 1/2011 |
| JP | 10-107571 A | 4/1998 |
| JP | 11-346472 A | 12/1999 |
| JP | 2001-285005 A | 10/2001 |
| JP | 2009-267596 A | 11/2009 |
| JP | 2009-303477 A | 12/2009 |
| JP | 2010-062986 A | 3/2010 |

OTHER PUBLICATIONS

International Search Report for PCT/JP2013/078154 dated Jan. 28, 2014.
Communication from European Patent Office dated Jun. 7, 2017 in European Patent Application No. 13895634.7.
Communication dated Oct. 13, 2017, from State Intellectual Property Office of the P.R.C. in counterpart application No. 201380080255.7.

* cited by examiner

NOISE FILTER

CROSS REFERENCE TO RELATED APPLICATIONS

This application is a National Stage of International Application No. PCT/JP2013/078154 filed Oct. 17, 2013, the contents of all of which are incorporated herein by reference in their entirety.

TECHNICAL FIELD

The present invention relates to a noise filter to be inserted into an AC power line or a DC line having undergone input current smoothing of electric equipment such as an AC-DC converter or inverter.

BACKGROUND ART

In various types of electric equipment products and electronic equipment products, conducted noise generated from a power line, communication line, or the like connected to electric equipment or electronic equipment needs to be restricted by EMC (Electromagnetic Compatibility) regulations or the like. Accordingly, a noise filter is connected between the commercial power line and various types of electronic equipment. However, such a noise filter cannot provide desired noise attenuation characteristics, so a technique for effectively suppressing noise needs to be developed.

For example, the technique disclosed in PTL 1 is known as a technique for improving the noise attenuation characteristics of such a noise filter. The technique disclosed in PTL 1 proposes to insert an electric conductor connected to a structure (such as the chassis or cabinet of a vehicle) kept at the ground potential between two common mode choke coils in a noise filter including common mode choke coils, capacitors, and the like.

The conventional art described above improves the noise attenuation characteristics that degrade due to the stray static capacitance caused by the windings of the common mode choke coils by breaking the coupling between the common mode choke coils due to the stray static capacitance present between the two common mode choke coils using the electric conductor inserted between the two common mode chokes. In addition, the conventional art improves the noise attenuation characteristics using the stray static capacitance generated between the common mode choke coils and the electric conductor as a line bypass capacitor that bypasses noise to the ground potential part.

CITATION LIST

Patent Literature

PTL 1: JP-A-11-346472

SUMMARY OF INVENTION

Technical Problem

However, the noise filter according to the conventional art has the following problems. That is, since the noise filter according to the conventional art uses the stray static capacitance generated between the common mode choke coils and the electric conductor as a line bypass capacitor, a capacitor is connected in parallel between the main circuit pattern and the ground potential part equivalently. As a result, since the cutoff frequency shifts to the low frequency side, the noise attenuation characteristics of the noise filter are improved in the low frequency band. However, since the impedance $(1/j\omega C)$ of the capacitor component becomes low in the high frequency band, the noise current having flowed to the ground potential part through a certain capacitor returns again to the main circuit pattern through another capacitor from the ground potential part, thereby degrading the noise attenuation characteristics of the noise filter in the high frequency band. In addition, the noise assumed by the noise filter according to the conventional art is conducted noise and effects of radiation noise are not considered. Therefore, in the conventional art, when a noise source is present in the vicinity of the filter, radiation noise from the noise source is mixed into the main circuit pattern. Accordingly, even if the conventional noise filter attenuates conducted noise, radiation noise is mixed into the main circuit pattern after passage through the filter, thereby degrading EMC performance.

Conventionally, the noise attenuation characteristics of a noise filter have not been analyzed in detail and have been addressed mainly in a cut-and-try method, so the cause of degradation of noise attenuation characteristics has not been identified. However, the analysis by the inventors et al. has identified the cause of degradation of noise attenuation characteristics of the conventional noise filter as described above.

The invention addresses the above problems of the conventional noise filter with an object of providing a noise filter that improves noise attenuation characteristics in consideration of radiation noise in addition to conducted noise without using a special circuit.

Solution to Problem

A noise filter according to the present invention includes a board, at least one coil mounted on the board, a board ground pattern formed on the board, and at least one capacitor mounted on the board, the at least one capacitor being connected between the at least one coil and the board ground pattern, the noise filter being inserted between a power source side and a load side of a main circuit for which noise is attenuated, the noise filter attenuating the noise of the main circuit using a filter circuit including the at least one coil and the at least one capacitor, in which the board ground pattern is separated into a plurality of board ground patterns, the separated board ground patterns are connected to a common ground member present outside the board, and the separated board ground patterns are formed as solid patterns and adjacent board ground patterns of the separated board ground patterns are disposed so as to have a spacing equal to or less than a predetermined distance.

Advantageous Effects of Invention

In the noise filter according to the invention, the board ground pattern is separated into a plurality of board ground patterns, the separated board ground patterns are connected to a common ground member present outside the board, and the separated board ground patterns are formed as solid patterns and adjacent board ground patterns of the separated board ground patterns are disposed so as to have a spacing equal to or less than a predetermined distance, so noise attenuation characteristics can be improved without using a special circuit.

DESCRIPTION OF EMBODIMENTS

Embodiment 1

Figure 1:
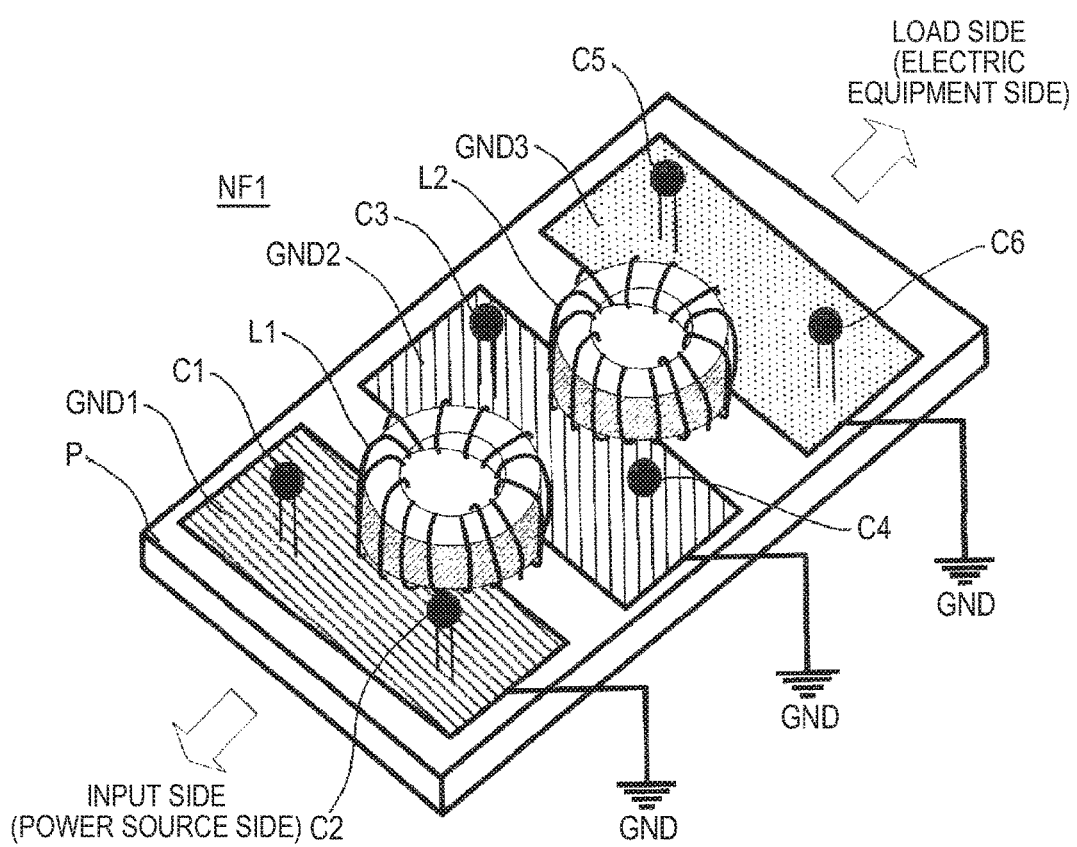
FIG. 1 is a perspective view schematically illustrating a noise filter according to embodiment 1 of the present invention.

A noise filter according to embodiment 1 of the present invention will be described below. FIG. 1 is a perspective view schematically illustrating the noise filter according to embodiment 1 of the invention. In FIG. 1, a noise filter NF1 includes a first common mode choke coil L1, which is a coil mounted on the surface of a filter board P as a board, and a second common mode choke coil L2. In addition, the noise filter NF1 includes a first line bypass capacitor C1, a second line bypass capacitor C2, a third line bypass capacitor C3, a fourth line bypass capacitor C4, a fifth line bypass capacitor C5, and a sixth line bypass capacitor C6, which are capacitors mounted on the surface of the filter board P, and a first board ground pattern GND1, a second board ground pattern GND2, and a third board ground pattern GND3, which are board ground patterns. These board ground patterns GND1, GND2, and GND3 are connected to a ground plane G, which is a structure (such as the chassis or the like of a vehicle) kept at the ground potential, but the board ground patterns are electrically separated from each other on the surface of the filter board P. In addition, the board ground patterns GND1, GND2, and GND3 are solid patterns and adjacent board ground patterns (GND1 and GND2, GND2 and GND3) are disposed so as to have a spacing less than one-half of the wavelength of a predetermined electromagnetic wave and equal to or less than a predetermined distance. The first board ground pattern GND1, the second board ground pattern GND2, and the third board ground pattern GND3 may be formed by printing electric conductors on the surface of the filter board P. In addition, the filter board P is a multilayer board and has a pattern structure including the board ground pattern on an outer layer and the main circuit pattern on an inner layer.

The first common mode choke coil L1 is disposed over the first board ground pattern GND1 and the second board ground pattern GND2 so as to be placed thereon, and the second common mode choke coil L2 is disposed over the second board ground pattern GND2 and the third board ground pattern GND3 so as to be placed thereon. The first line bypass capacitor C1 and the second line bypass capacitor C2 are disposed on the first board ground pattern GND1 and the third line bypass capacitor C3 and the fourth line bypass capacitor C4 are disposed on the second board ground pattern GND2, and the fifth line bypass capacitor C5 and the sixth line bypass capacitor C6 are disposed on the third board ground pattern GND3.

In the noise filter NF1 illustrated in FIG. 1, the lower left side in FIG. 1 is connected to the input side main circuit pattern on the input side (the power source side) and the upper right side is connected to the load side main circuit pattern on the load side (the electric equipment side).

Figure 2:
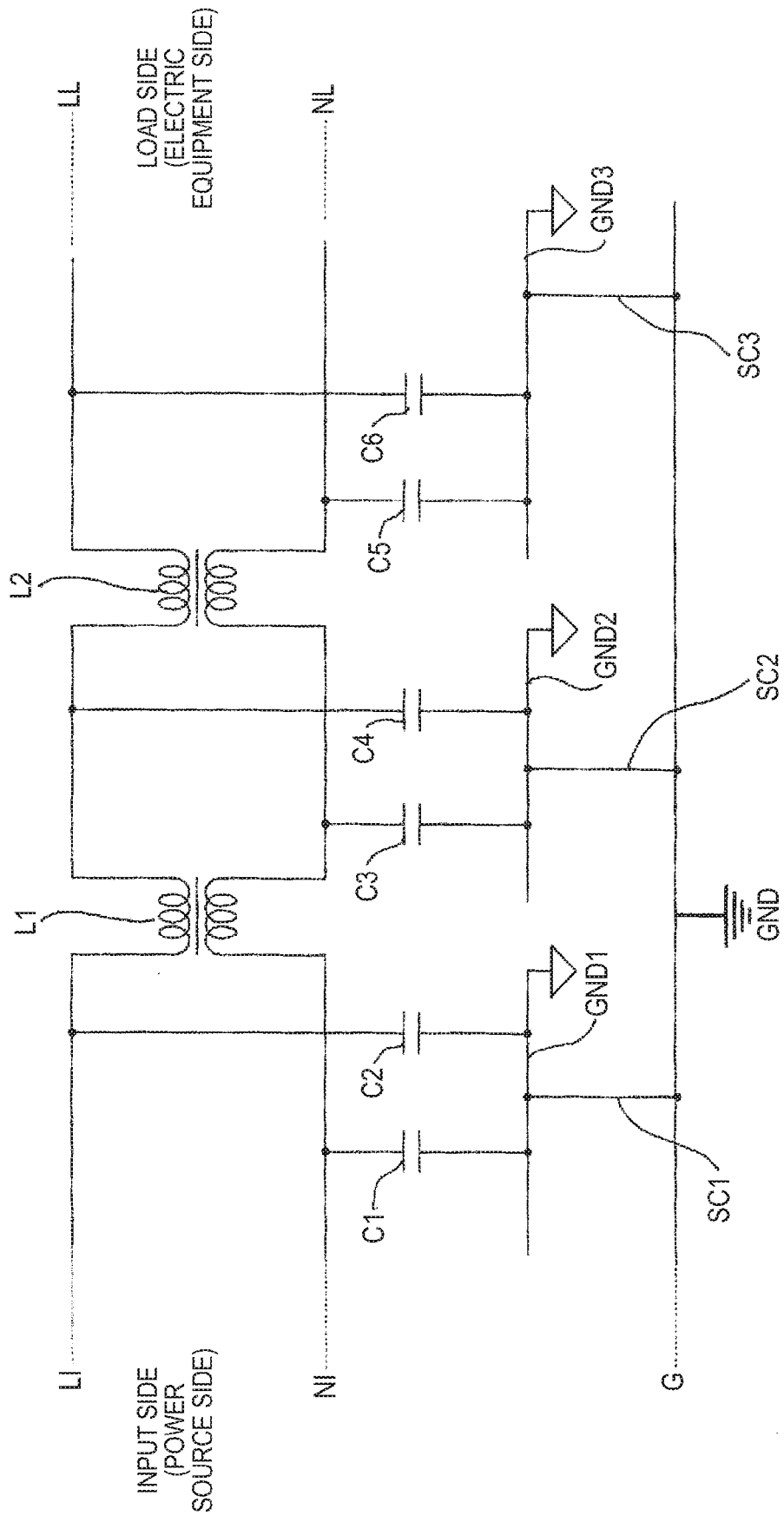
FIG. 2 is an equivalent circuit diagram used to describe the operation of the noise filter according to embodiment 1 of the invention.

FIG. 2 is an equivalent circuit diagram used to describe the operation of the noise filter according to embodiment 1 of the invention. In FIG. 2, the noise filter NF1 according to embodiment 1 of the invention has the input side connected to input side main circuit patterns LI and NI and the load side connected to load side main circuit patterns LL and NL. The first common mode choke coil L1 and the second common mode choke coil L2 are connected in series between the input side and the load side of the noise filter NF1.

The first line bypass capacitor C1 is connected between the input side main circuit pattern NI and the first board ground pattern GND1. The second line bypass capacitor C2 is connected between the input side main circuit pattern LI and the first board ground pattern GND1. The third line bypass capacitor C3 is connected between an interconnection section NC of one of the first and second common mode choke coils L1 and L2 and the second board ground pattern GND2. The fourth line bypass capacitor C4 is connected between an interconnection section LC of the other of the first and second common mode choke coils L1 and L2 and the second board ground pattern GND2.

The fifth line bypass capacitor C5 is connected between the load side main circuit pattern NL and the third board ground pattern GND3. The sixth line bypass capacitor C6 is connected between the load side main circuit pattern LL and the third board ground pattern GND3. The first board ground pattern GND1 is connected to the ground plane G by a first connection member SC1 such as a screw. The second board ground pattern GND2 is connected to the ground plane G by a second connection member SC2 such as a screw. The third board ground pattern GND3 is connected to the ground plane G by a third connection member SC3 such as a screw. The ground plane G is connected to a structure (such as the chassis or cabinet of a vehicle) kept at the ground potential.

A certain impedance is formed between the first to third board ground patterns GND1, GND2, and GND3 and the ground plane G connected as described above by the first to third connection members SC1, SC2, and SC3 such as screws.

As described above, in the noise filter according to embodiment 1 of the invention, the board ground pattern on an outer layer of the filter board P is formed as the first to third board ground patterns GND1, GND2, and GND3 electrically separated from each other, the first and second line bypass capacitors C1 and C2 are connected between the front (input side) of the first common mode choke coil L1 and the first board ground pattern GND1, the third and fourth line bypass capacitors C3 and C4 are connected between the interconnection sections NC and NL of the first and second common mode choke coils L1 and L2 and the second board ground pattern GND2, the fifth and sixth line bypass capacitors C5 and C6 are connected between the rear (load side) of the second common mode choke coil L2 and the third board ground pattern GND3, the first to third board ground patterns GND1, GND2, and GND3 electrically separated from each other are formed as solid patterns, the distances between adjacent board ground patterns (that is, the distance between the first board ground pattern GND1 and the second board ground pattern GND2 and the distance between the second board ground pattern GND2 and the third board ground pattern GND3) are equal to or less than a predetermined distance.

Comparative Example 1

Figure 3:
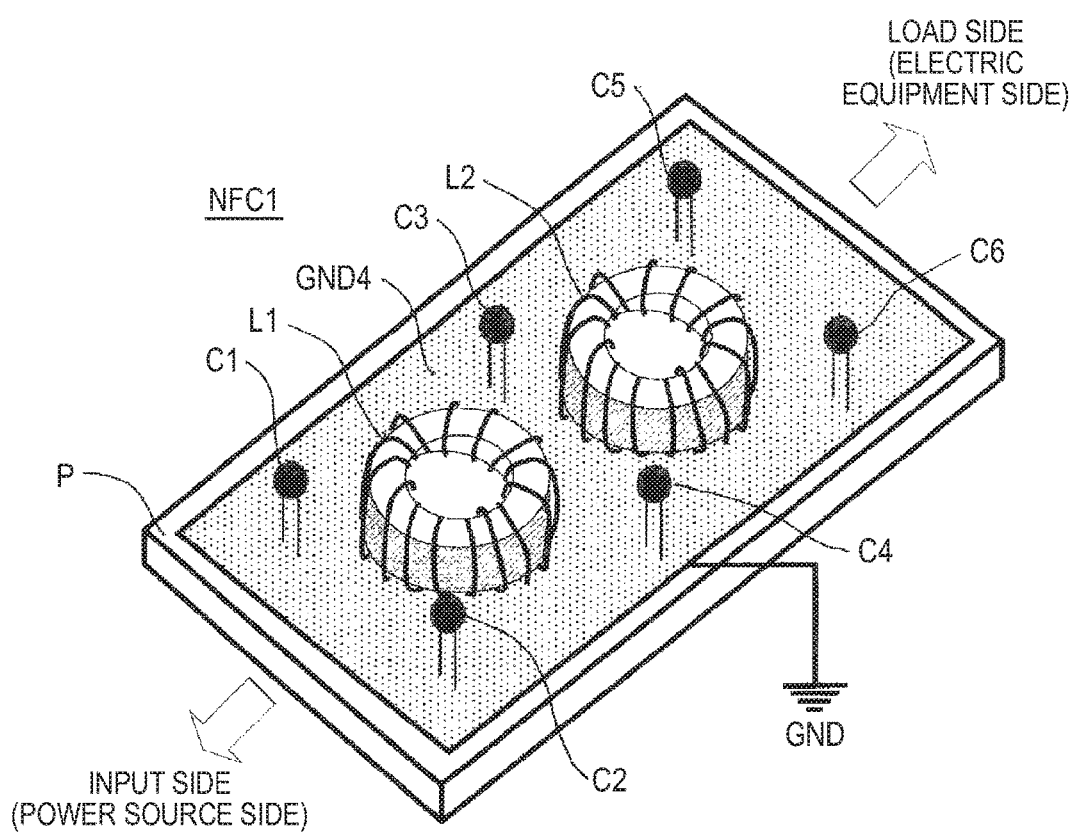
FIG. 3 is a perspective view schematically illustrating a noise filter according to comparative example 1.
Figure 4:
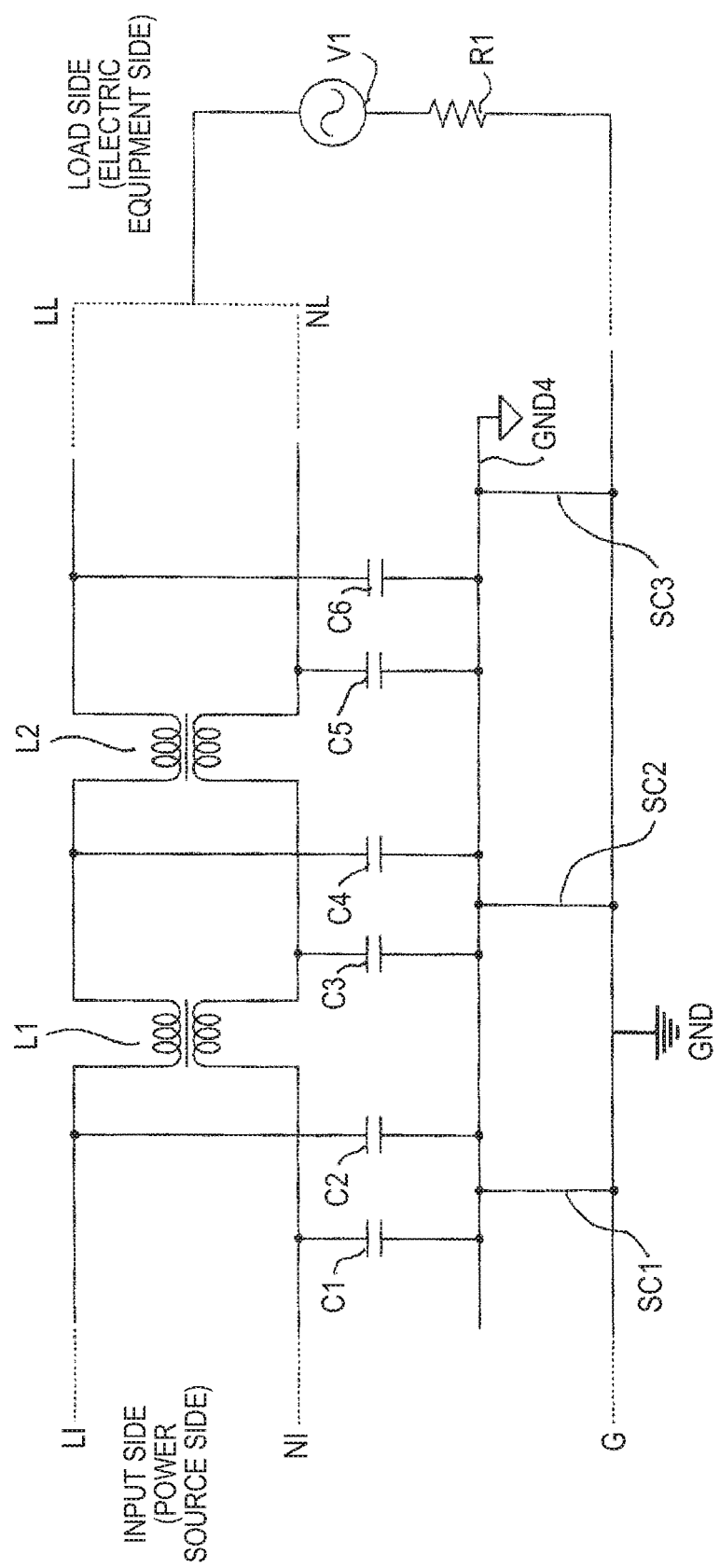
FIG. 4 is an equivalent circuit used to describe the operation of the noise filter according to comparative example 1.

Next, a noise filter according to comparative example 1 will be described to understand the operation of the noise filter according to embodiment 1 of the invention. FIG. 3 is a perspective view schematically illustrating a noise filter NFC1 according to comparative example 1 and FIG. 4 is an equivalent circuit used to describe the operation of the noise filter according to comparative example 1. Components identical or equivalent to those in the noise filter according to embodiment 1 of the invention shown in FIGS. 1 and 2 are given the same reference numerals. In FIG. 3, the noise filter NFC1 according to comparative example 1 has one consecutive common board ground pattern GND4 on the filter board P. The first and second common mode choke coils L1 and L2 and the first to sixth line bypass capacitors C1 to C6 are mounted on the common board ground pattern GND4, and the common board ground pattern GND4 is connected to the ground plane G by the first to third connection members SC1 to SC3 such as screws. In addition, it is assumed that a noise source V1 is present on the load side (LL and NL sides) in FIG. 4. R1 indicates a noise source resistor. The other structure is the same as in embodiment 1.

Figure 5:
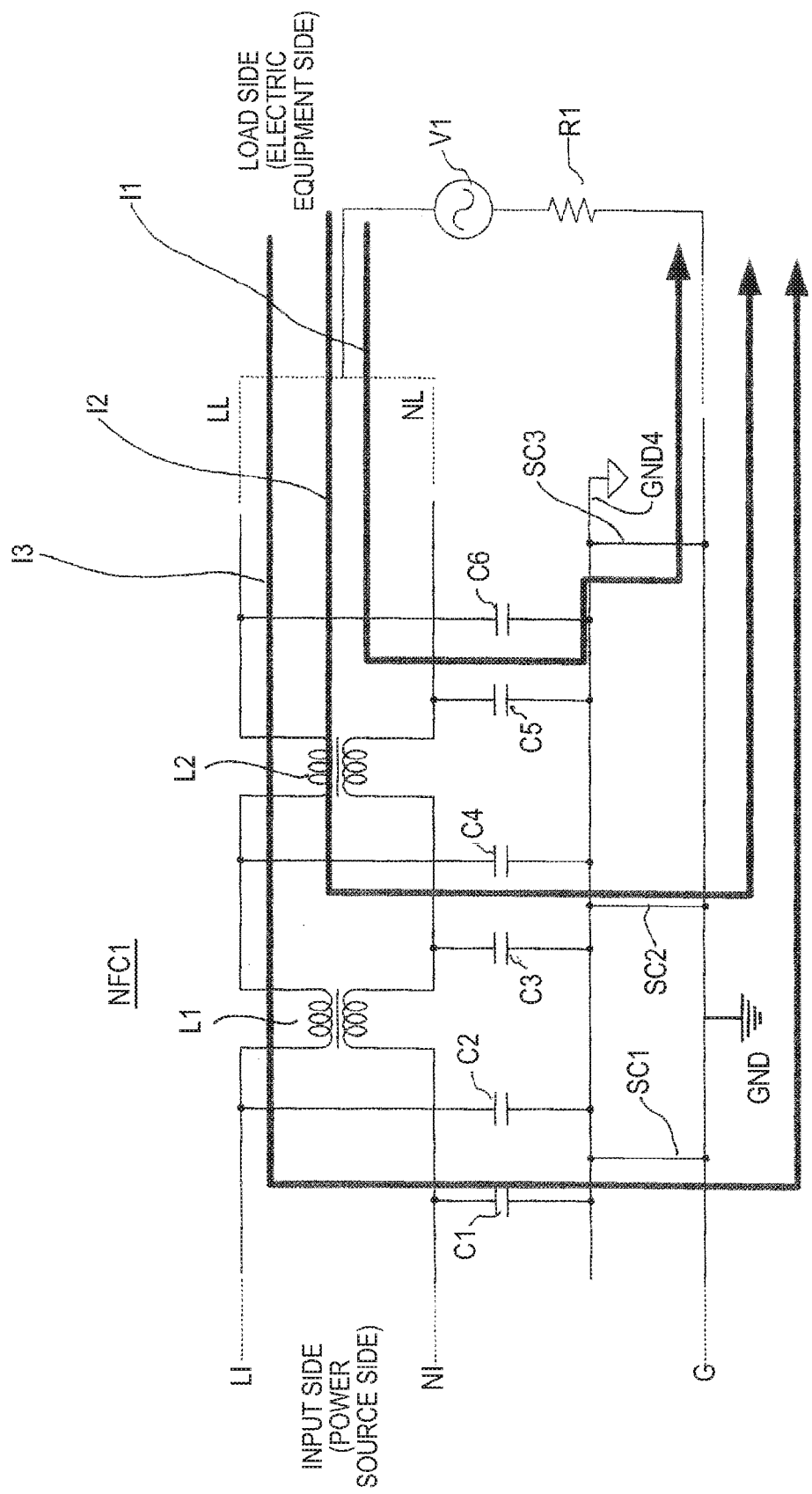
FIG. 5 illustrates the ideal current path of noise current in the noise filter according to comparative example 1.

FIG. 5 illustrates the ideal current path of noise current in the noise filter according to comparative example 1. Generally, the value of noise current generated from the noise source V1 is determined by the impedance ratio between the common mode choke coils and line bypass capacitors.

The wiring impedance on the load side of the noise filter NFC1 (that is, the impedance ZL of the second common mode choke coil L2) is represented by expression (1) below and the impedance ZC of the fifth and sixth line bypass capacitors C5 and C6 is represented by expression (2) below.

[Math. 1]

$$Z_L = j\omega L \qquad \text{Expression (1)}$$

$$Z_C = \frac{1}{j\omega C} \qquad \text{Expression (2)}$$

When ZL>>ZC, a part of noise current generated from the noise source V1 flows through a first noise current path I1 and returns to the noise source V1.

Similarly, the impedance ZC of the third and fourth line bypass capacitors C3 and C4 is represented by expression (2) above. When ZL>>ZC, another part of noise current generated from the noise source V1 flows through a second noise current path I2 and returns to the noise source V1.

Another part of noise current generated from the noise source V1 flows through a third noise current path I3 and returns to the noise source V1. The noise current flowing through the third noise current path I3 is determined by the wiring impedance (that is, the impedance ratio between the impedance ZL of the first common mode choke coil L1 and the impedance ZC of the first and second line bypass capacitors C1 and C2) of the input side of the noise filter NFC1. The impedance ZL of the first common mode choke coil L1 is represented similarly by the above expression (1) and the impedance ZC of the first and second line bypass capacitors C1 and C2 is represented by the above expression (2). When ZL>>ZC, as described above, another part of noise current generated from the noise source V1 flows through the third noise current path I3 passing through the input side of the noise filter NFC1 and returns to the noise source V1.

The ideal current path of noise current in the noise filter according to comparative example 1 is illustrated in FIG. 5. However, since a connection member such as a screw has an impedance, the intrinsic impedance is present between the common board ground pattern GND4 and the ground plane G. Accordingly, noise current flows through a noise current path other than the path illustrated in FIG. 5.

Figure 6:
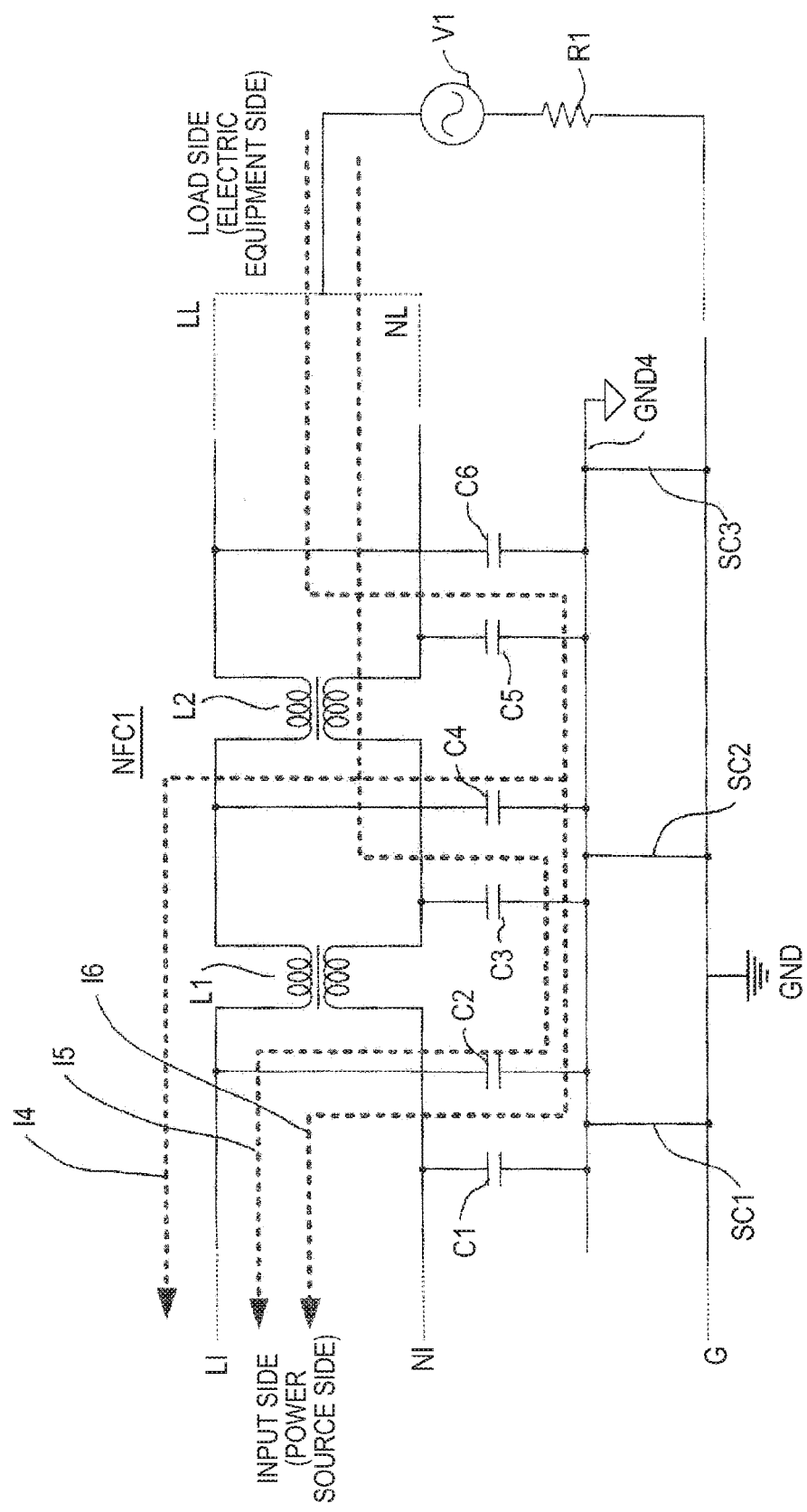
FIG. 6 illustrates the actual current path of noise current in the noise filter according to comparative example 1.

FIG. 6 illustrates the actual current path of noise current in the noise filter according to comparative example 1. When the board ground pattern on the filter board P is formed as one common board ground pattern GND4 in FIG. 6 as described above, apart of the noise current passing through, for example, the third to sixth line bypass capacitors C3, C4, C5, and C6 and flowing through the common board ground pattern GND4 flows through a fifth noise current path I5 and a sixth noise current path I6 passing through the first and second line bypass capacitors C1 and C2 having impedances smaller than the impedances of the first to third connection members SC1, SC2, and SC3 including screws or the like via the common board ground pattern GND4 and leading to the input side of the filter board P and flows to the input side (that is, the power source side of the main circuit) of the noise filter NFC1.

In addition, the common mode chokes have the stray static capacitance of the windings. As a result, a part of the noise current flowing through the fifth and sixth line bypass capacitors C5 and C6 similarly flows through a fourth noise current path I4 passing through the third and fourth line bypass capacitors C3 and C4 and the stray static capacitance of the first common mode choke coil L1 via the common board ground pattern GND4 and leading to the input side of a noise filter NFV1.

When the filter board P has one common board ground pattern GND4 as in the noise filter NFC1 according to comparative example 1, noise current flows from the input side of the noise filter NFC1 to the power source side of the main circuit via the fourth to sixth noise current paths I4, I5, and I6 as described above and causes the noise attenuation characteristics of the noise filter to degrade in a high frequency band.

Figure 7:
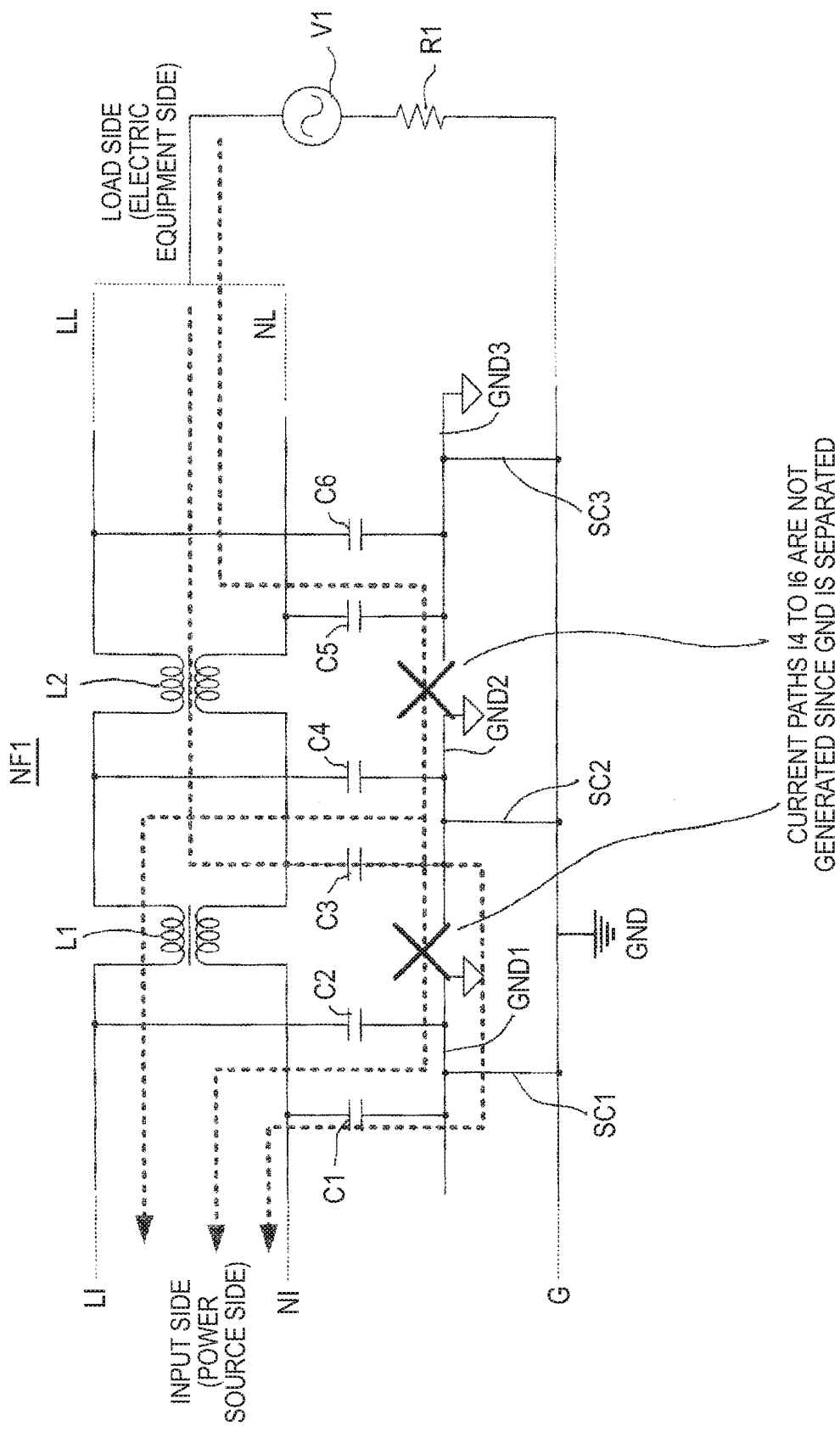
FIG. 7 illustrates the current path of noise current in the noise filter according to embodiment 1 of the invention.

Here, the operation of the noise filter according to embodiment 1 of the invention illustrated in FIGS. 1 and 2 will be described. FIG. 7 illustrates the current path of noise current in the noise filter according to embodiment 1 of the invention. In FIG. 7, the board ground pattern provided on the filter board P is separated into the first to third board ground patterns GND1, GND2, and GND3, which are not electrically connected to each other on the filter board P, as described above. Accordingly, the fourth to sixth noise current paths I4, I5, and I6 generated in the noise filter NFC1 according to comparative example 1 are not formed, the first to third noise current paths I1, I2, and I3, which are ideal noise current paths illustrated in FIG. 5, are formed, and the noise current generated in the noise source V1 returns to the noise source V1 through the first to third connection members SC1, SC2, and SC3 and the ground plane G.

Suppression of degradation of noise attenuation characteristics due to conducted noise has been described above. Next, suppression of degradation of noise attenuation characteristics due to radiation noise will be described.

When a noise source is present in the vicinity of the noise filter NF1, noise is mixed into the main circuit pattern of the filter board P from the noise source via the air (not illustrated). Accordingly, even when the attenuation characteristics of conducted noise are improved, if radiation noise is mixed into the main circuit pattern, the attenuation characteristics degrade eventually. Therefore, by forming the first to third board ground patterns GND1, GND2, and GND3 as the surface layer patterns and forming these patterns as solid patterns, mixture of noise into the main circuit pattern is suppressed since radiation noise is grounded to the ground plane G via the first to third board ground patterns GND1, GND2, and GND3, which are surface layers. In addition, when the distance between the first and second board ground patterns GND1 and GND2 adjacent to each other and the distance between the second and third board ground patterns GND2 and GND3 adjacent to each other are equal to or more than one-half of the wavelength of a predetermined electromagnetic wave, the electromagnetic wave passes the spacing. To prevent this, the first and second board ground patterns GND1 and GND2 adjacent to each other and the second and third board ground patterns GND2 and GND3 adjacent to each other are disposed so as to have a spacing equal to or less than a predetermined distance to prevent radiation noise with a predetermined frequency or less from being mixed into the main circuit pattern.

As described above, in the noise filter NF1 according to embodiment 1 of the invention, the board ground pattern on an outer layer of the filter board P is formed as the first to third board ground patterns GND1, GND2, and GND3 electrically separated from each other, the first and second line bypass capacitors C1 and C2 are connected between the front (input side) of the first common mode choke coil L1 and the first board ground pattern GND1, the third and fourth line bypass capacitors C3 and C4 are connected between the interconnection sections NC and NL of the first and second common mode choke coils L1 and L2 and the second board ground pattern GND2, and the fifth and sixth line bypass capacitors C5 and C6 are connected between the rear (load side) of the second common mode choke coil L2 and the third board ground pattern GND3. Accordingly, the noise current path leading to the power source side of the main circuit from the input side of the noise filter NF1 is not formed and the noise current generated from the noise source V1 thereby returns to the noise source V1 through the first to third noise current paths I1, I2, and I3, so the noise attenuation characteristics of conducted noise of the noise filter NF1 do not degrade. In addition, the first to third board ground patterns GND1, GND2, and GND3 electrically separated from each other are formed as solid patterns and the first board ground pattern GND1 and the second board ground pattern GND2 adjacent to each other and the second board ground pattern GND2 and the third board ground pattern GND3 adjacent to each other are disposed so as to have a spacing equal to or less than a predetermined distance to prevent the mixture of radiation noise into the main circuit pattern, so the noise attenuation characteristics of radiation noise of the noise filter NF1 do not degrade.

Embodiment 2

Figure 8:
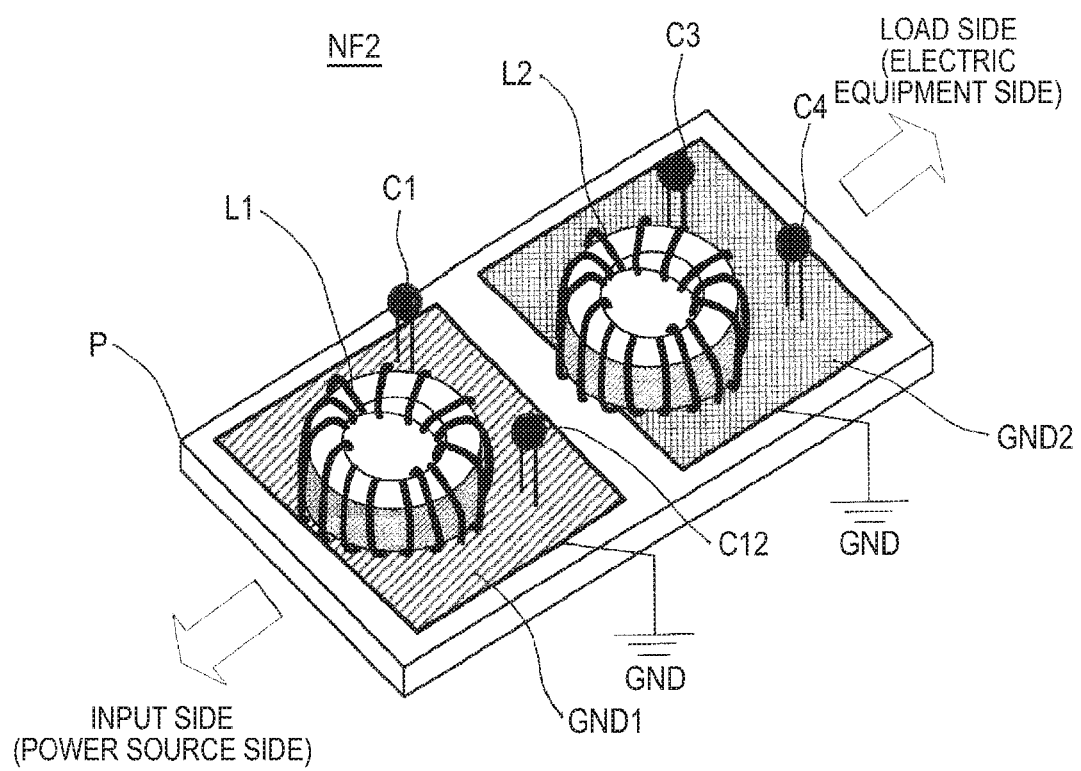
FIG. 8 is a perspective view schematically illustrating a noise filter according to embodiment 2 of the invention.

FIG. 8 is a perspective view schematically illustrating a noise filter according to embodiment 2 of the invention. In FIG. 8, the filter board P is provided with the first and second choke coils L1 and L2, the first to fourth line bypass capacitors C1, C2, C3, and C4, and the first and second board ground patterns GND1 and GND2 as board ground patterns. Here, a filter circuit F1 including the first choke coil L1 and the first and second line bypass capacitors C1 and C2 is referred to as a first filter circuit and a filter circuit F2 including the first second choke coil L2 and the third and fourth line bypass capacitors C3 and C4 is referred to as a second filter circuit.

The first board ground pattern GND1 and second board ground pattern GND2 are separately provided for each of the first filter circuit F1 and the second filter circuit F2 and the first and second board ground patterns GND1 and GND2 are not electrically connected to each other on the filter board P. The first board ground pattern GND1 is connected to the ground plane G by the first connection member SC1 such as a screw and the second board ground pattern GND2 is connected to the ground plane G by the second connection member SC2 such as a screw. Accordingly, the first board ground pattern GND1 and the second board ground pattern GND2 are electrically connected to each other via the first and second connection members SC1 and SC2 and the ground plane G. The ground plane G is connected to a structure (such as the chassis or cabinet of a vehicle) kept at the ground potential. In addition, as in embodiment 1, the first and second board ground patterns GND1 and GND2 are solid patterns, the first and second board ground patterns GND1 and GND2 adjacent to each other are disposed so as to have a spacing less than one-half of the wavelength of a predetermined electromagnetic wave and equal to or less than a predetermined distance, and the filter board P is a multilayer board including the first and second board ground patterns GND1 and GND2 on an outer layer and the main circuit pattern on an inner layer.

The first common mode choke coil L1 is disposed on the first board ground pattern GND1 and the second common mode choke coil L2 is disposed on the second board ground pattern GND2. The first line bypass capacitor C1 and the second line bypass capacitor C2 are disposed on the first board ground pattern GND1 and the third line bypass capacitor C3 and the fourth line bypass capacitor C4 are disposed on the second board ground pattern GND2.

In the noise filter INF2 illustrated in FIG. 8, the lower left side in FIG. 8 is connected to the input side main circuit pattern on the input side (the power source side) and the upper right side is connected to the load side main circuit pattern on the load side (the electric equipment side).

Figure 9:
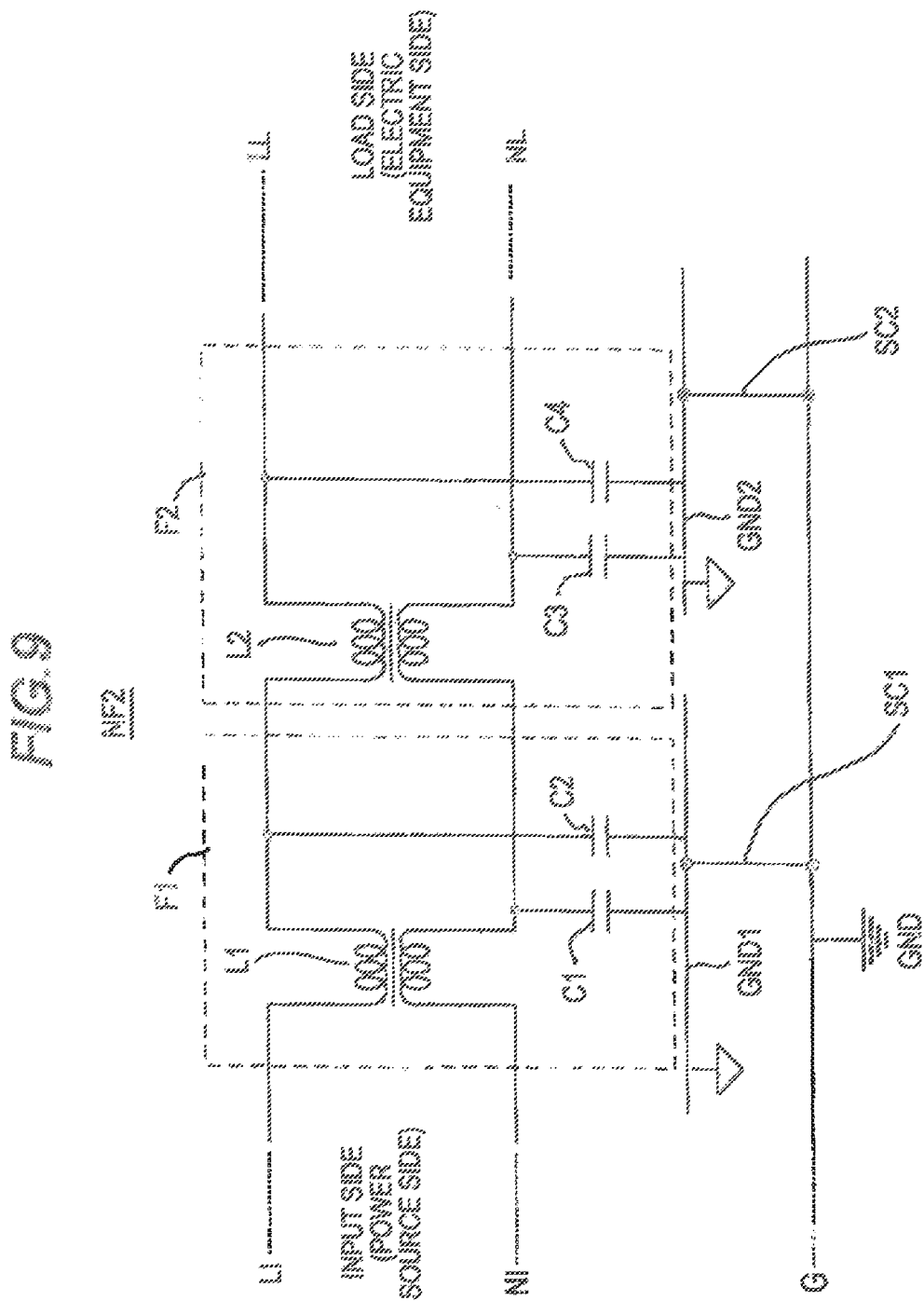
FIG. 9 is an equivalent circuit diagram used to describe the operation of the noise filter according to embodiment 2 of the invention.

FIG. 9 is an equivalent circuit diagram used to describe the operation of the noise filter according to embodiment 2 of the invention. In FIG. 9, a noise filter NF2 according to embodiment 2 of the invention has an input side connected to the input side main circuit patterns LI and NI and a load side connected to the load side main circuit patterns LL and NL. The first common mode choke coil L1 and the second common mode choke coil L2 are connected in series between the input side and the load side of the noise filter NF2. The input side main circuit pattern LI and the load side main circuit pattern LL are connected to each other via the first and second common mode choke coils L1 and L2 and the input side main circuit pattern NI and the load side main circuit pattern NL are connected to each other via the first and second common mode choke coils L1 and L2.

The first line bypass capacitor C1 is connected between one interconnection section NC of the first and second common mode choke coils L1 and L2 and the first board ground pattern GND1. The second line bypass capacitor C2 is connected between the other interconnection section LC of the first and second common mode choke coils L1 and L2 and the first board ground pattern GND1. The third line bypass capacitor C3 is connected between the load side main circuit pattern NL and the second board ground pattern GND2. The fourth line bypass capacitor C4 is connected between the load side main circuit pattern LL and the second board ground pattern GND2.

As described above, the first and second line bypass capacitors C1 and C2 in the first filter circuit F1 are disposed on the load side of the first common mode choke coil L1 and the third and fourth line bypass capacitors C3 and C4 in the second filter circuit F2 are disposed on the load side of the second common mode choke coil L2. In this case, it is assumed that the noise source is disposed on the load side of the main circuit. When it is assumed that the noise source is disposed on the input side of the main circuit, the first and second line bypass capacitors C1 and C2 in the first filter circuit F1 are disposed on the input side of the first common mode choke coil L1 and the third and fourth line bypass capacitors C3 and C4 in the second filter circuit F2 are disposed on the input side of the second common mode choke coil L2.

Comparative Example 2

Figure 10:
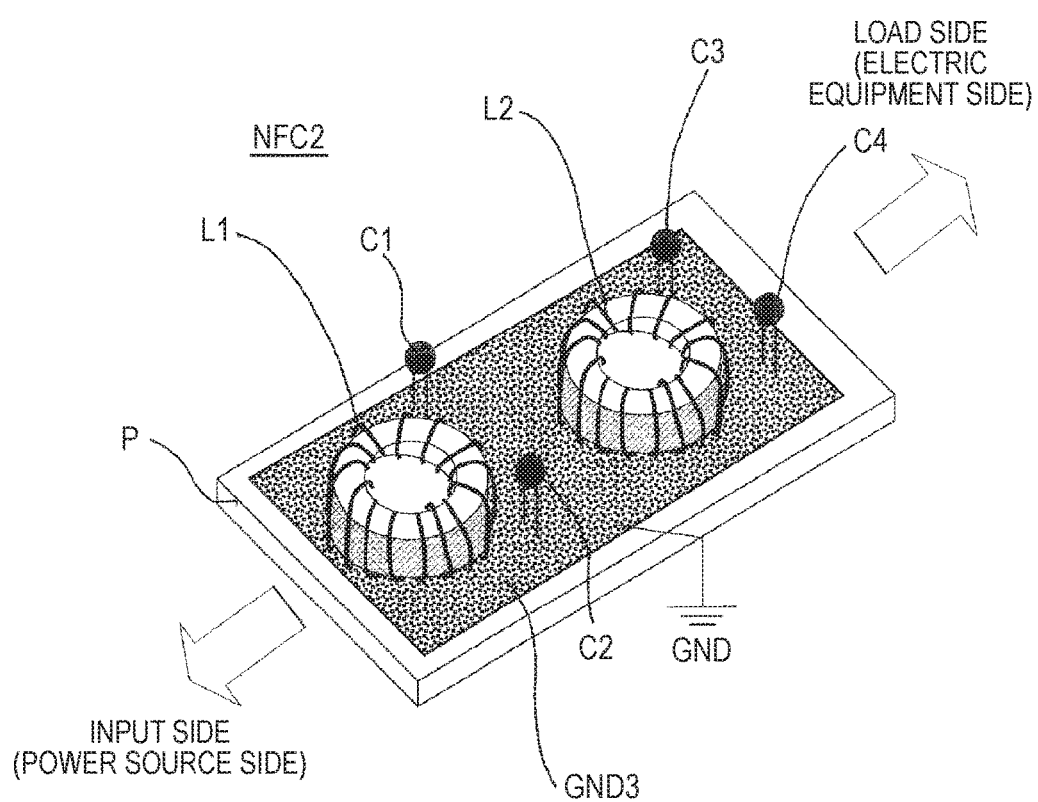
FIG. 10 is a perspective view schematically illustrating a noise filter according to comparative example 2.
Figure 11:
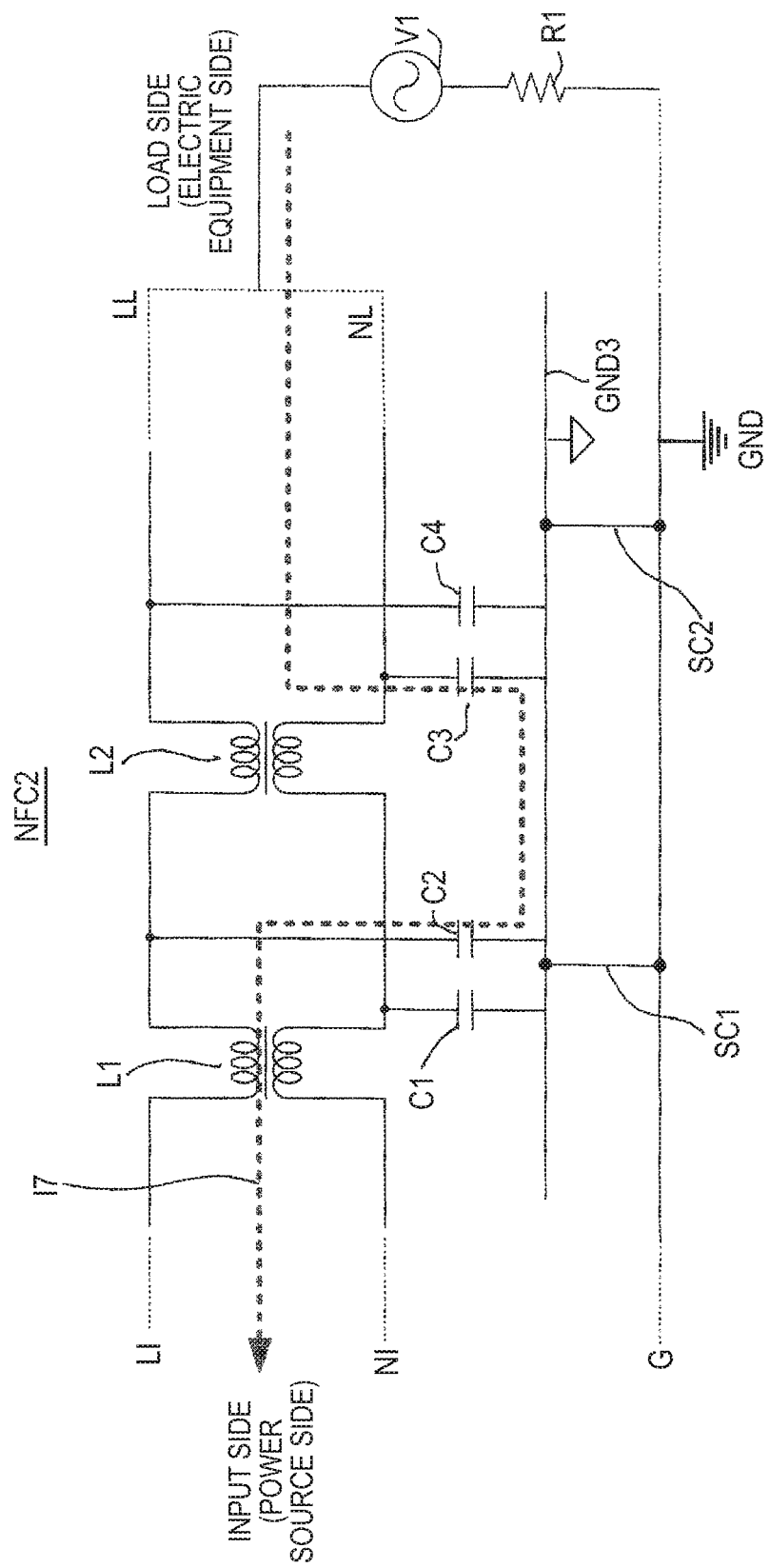
FIG. 11 is an equivalent circuit used to describe the operation of the noise filter according to comparative example 2.

Next, a noise filter according to comparative example 2 will be described to understand the operation of the noise filter according to embodiment 2 of the invention. FIG. 10 is a perspective view schematically illustrating a noise filter according to comparative example 2. A noise filter NFC2 according to comparative example 2 illustrated in FIG. 10 has the same filter structure as the noise filter NF2 according to embodiment 2 in FIG. 8 above except that the board ground pattern on the filter board P is formed by one common board ground pattern GND3. FIG. 11 is an equivalent circuit used to describe the operation of the noise filter NFC2 according to comparative example 2.

Since a connection member such as a screw has an impedance in the noise filter NFC2 according to comparative example 2, the intrinsic impedance is present between the common board ground pattern GND3 and the ground plane G. In addition, the first common mode choke coil L1 has the stray static capacitance of the winding. Accordingly, when the board ground pattern is formed as one common board ground pattern GND3 as in the noise filter NFC2 according to comparative example 2, as indicated by the dashed line arrow in FIG. 11, a part of the noise current generated from the noise source V1 flows to the power source side of the main circuit through a seventh current path I7 passing through the first and second line bypass capacitors C1 and C2 and the first common mode choke coil L1 of the first filter circuit F1 via the second common mode choke coil L2, the third and fourth line bypass capacitors C3 and C4, and the common board ground pattern GND3 of the second filter circuit F2 and leading to the input side. This causes degradation of the noise attenuation characteristics of the noise filter NFC2 in a high frequency band.

Figure 12:
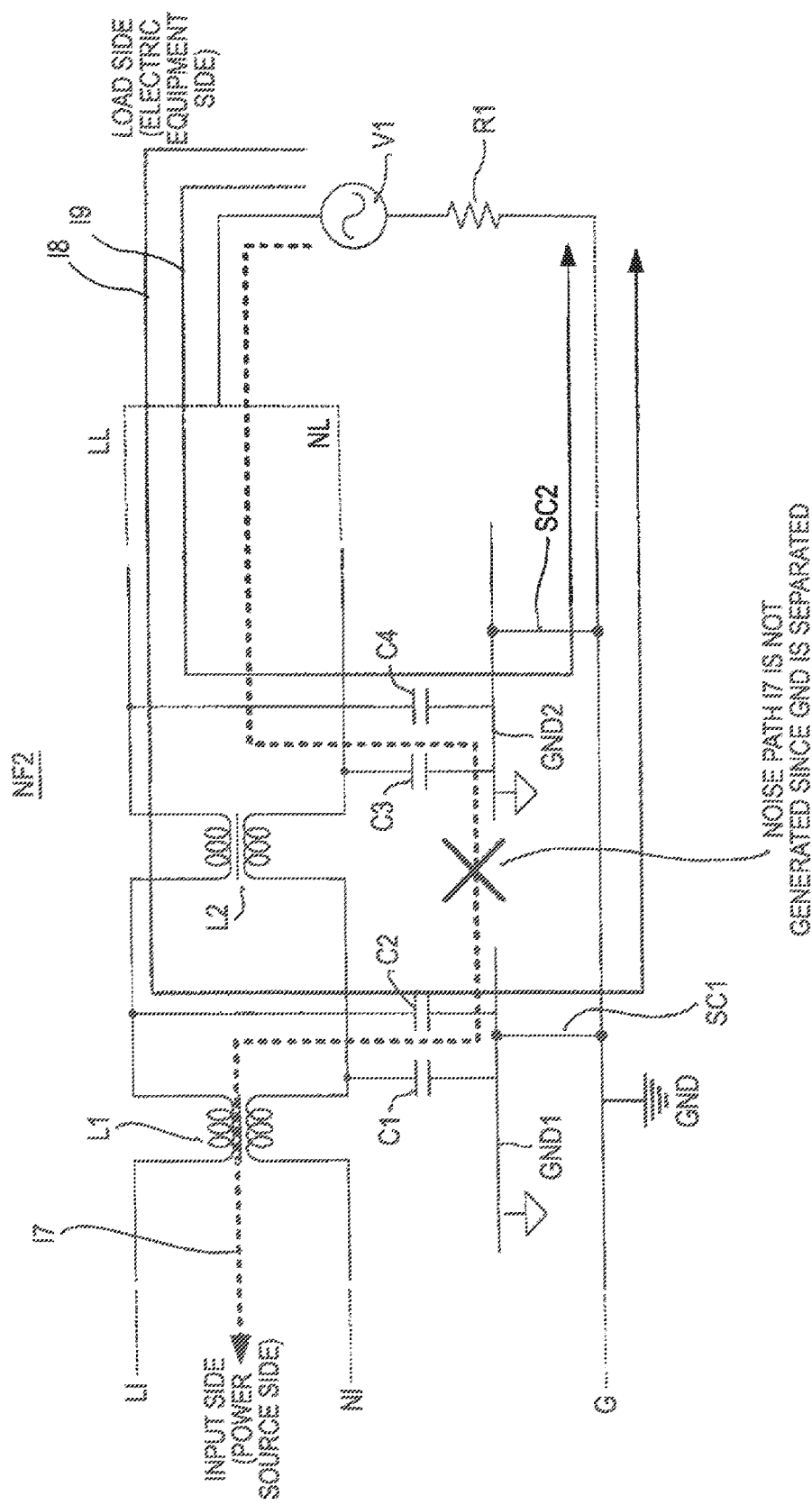
FIG. 12 illustrates the current path of noise current in the noise filter according to embodiment 2 of the invention.

Here, the operation of the noise filter according to embodiment 2 of the invention in FIGS. 8 and 9 will be described. FIG. 12 illustrates the current path of noise current in the noise filter according to embodiment 2 of the invention. In FIG. 12, as described above, the board ground pattern provided on the filter board P is separated and formed as the first and second board ground patterns GND1 and GND2, which are not electrically connected to each other on the filter board P. Accordingly, the seventh noise current path I7 generated in the noise filter NFC2 according to comparative example 2 is not formed, eighth and ninth noise current paths I8 and I9 are formed, and the noise current generated from the noise source V1 returns to the noise source V1 via the first and second connection members SC1 and SC2 and the ground plane G.

The eighth noise current path I8 leads to the noise source V1 via the first common mode choke coil L1, the first and second line bypass capacitors C1 and C2, the first board ground pattern GND1, the first connection member SC1, and the ground plane G. The ninth noise current path I9 leads to the noise source V1 via the second common mode choke coil L2, the third and fourth line bypass capacitors C3 and C4, the second board ground pattern GND2, the second connection member SC2, and the ground plane G.

Suppression of degradation of noise attenuation characteristics due to conducted noise has been described above. Next, suppression of degradation of noise attenuation characteristics due to radiation noise will be described.

As in embodiment 1, when a noise source is present in the vicinity of the noise filter NF2, noise is mixed into the main circuit pattern of the filter board P from the noise source via the air (not illustrated). To prevent this, the first board ground pattern GND1 and the second board ground pattern GND2 adjacent to each other are disposed so as to have a spacing equal to or less than a predetermined distance to prevent radiation noise with a predetermined frequency or less from being mixed into the main circuit pattern.

As described above, in the noise filter NF2 according to embodiment 2 of the invention, the board ground pattern provided on an outer layer of the filter board P is formed as the first and second board ground patterns GND1 and GND2 electrically separated from each other, the first and second line bypass capacitors C1 and C2 are connected between the interconnection sections NC and NL of the first and second common mode choke coils L1 and L2 and the first board ground pattern GND1, and the third and fourth line bypass capacitors C3 and C4 are connected between the rear (load side) of the second common mode choke coil L2 and the second board ground pattern GND2, so the noise current path leading to the power source side of the main circuit from the input side of the noise filter NF2 is not formed. Accordingly, the noise current generated from the noise source V1 returns to the noise source V1 through the eighth and ninth noise current paths I8 and I9, so the noise attenuation characteristics of the noise filter NF2 are improved. In addition, the first and second board ground patterns GND1 and GND2 electrically separated from each other are formed as solid patterns and the first board ground pattern GND1 and the second board ground pattern GND2 adjacent to each other are disposed so as to have a spacing equal to or less than a predetermined distance to prevent radiation noise from being mixed into the main circuit pattern, so that the noise attenuation characteristics of radiation noise of the noise filter NF2 do not degrade.

Figure 13:
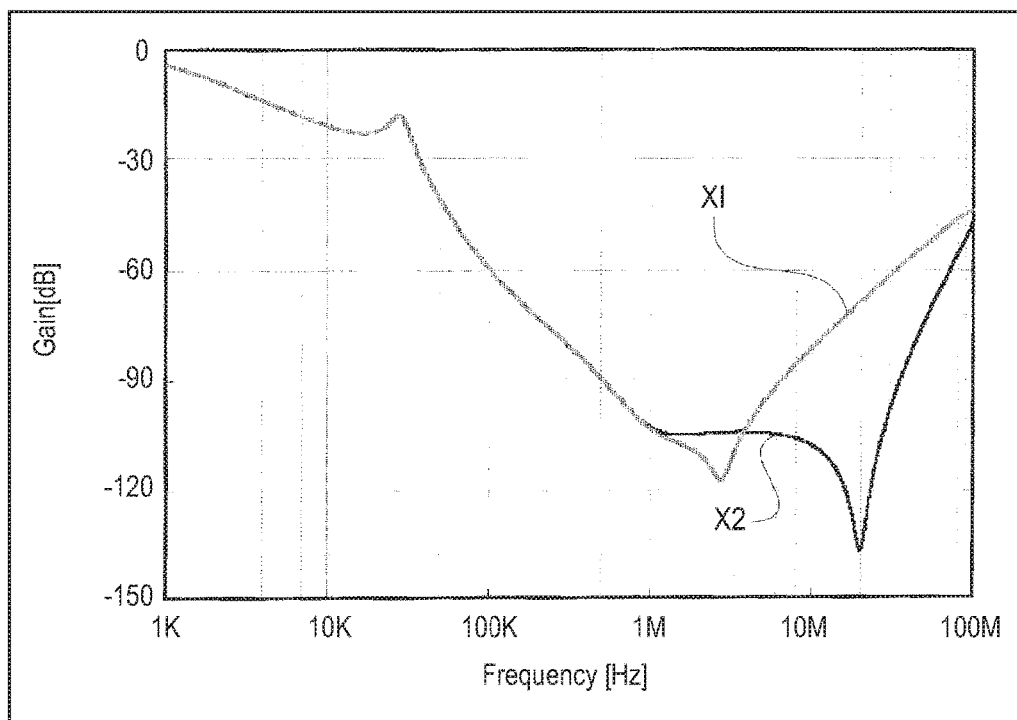
FIG. 13 is a characteristic diagram illustrating the noise attenuation characteristics of the noise filter.

FIG. 13 is a characteristic diagram illustrating the noise attenuation characteristics of a noise filter and the horizontal axis indicates the frequency (Hz) and the vertical axis indicates the gain (amount of noise attenuation) (dB) and a smaller gain value represents a larger amount of noise attenuation. In FIG. 13, characteristic X1 represents the noise attenuation characteristic of the conventional noise filter having a common board ground pattern on the board and characteristic X2 represents the noise attenuation characteristic when the noise filter according to embodiment 2 of the invention is used. As illustrated in FIG. 13, in the structure of the noise filter according to embodiment 2 of the invention, the attenuation characteristics of the noise filter are improved. This is also true of the noise filter according to embodiment 1 of the invention.

Although the noise filter according to embodiment 2 of the invention is assumed to have two stages of filter circuits including coils and capacitors, the invention is not limited to embodiment 2 and may have three or more stages of filter circuits.

Embodiment 3

Figure 14:
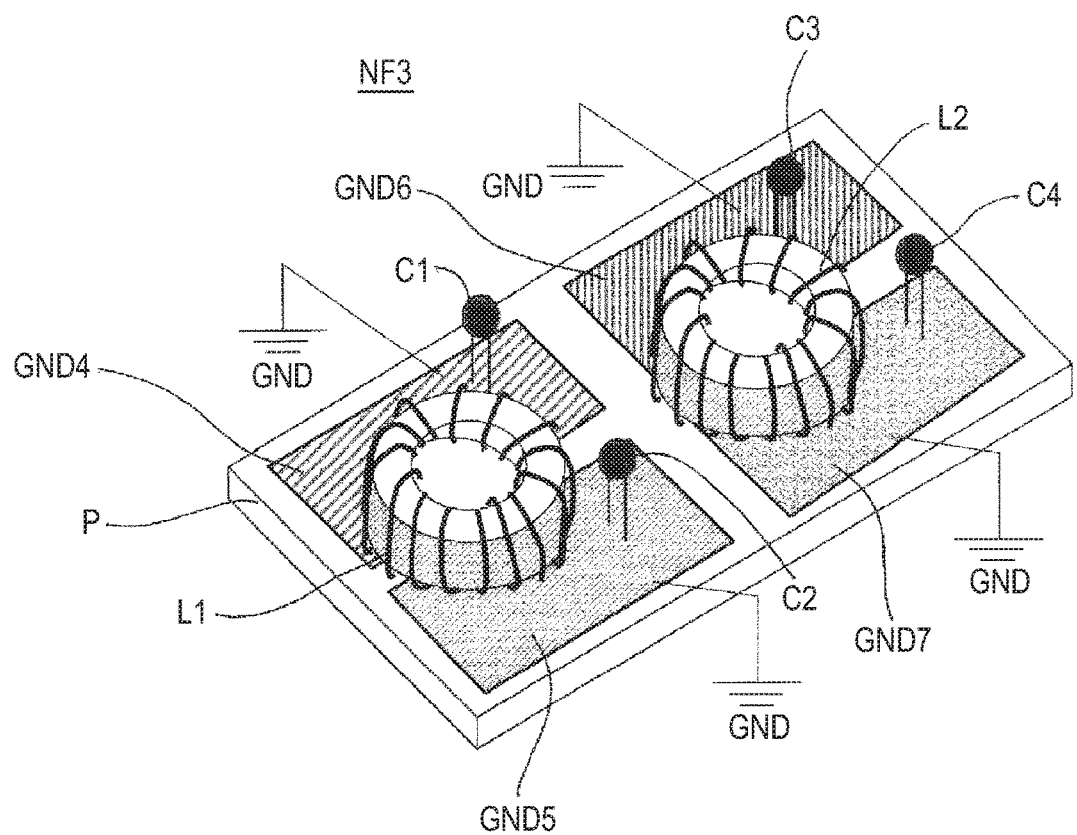
FIG. 14 is a perspective view schematically illustrating a noise filter according to embodiment 3 of the invention.

FIG. 14 is a perspective view schematically illustrating a noise filter according to embodiment 3 of the invention. In FIG. 14, on the filter board P, the first and second common mode choke coils L1 and L2, the first to fourth line bypass capacitors C1, C2, C3, and C4, the first and second board ground patterns GND4 and GND5, and the third and fourth board ground patterns GND6 and GND7 are provided. The first common mode choke coil L1 is disposed over the first and second board ground patterns GND4 and GND5 and the second common mode choke coil L2 is disposed over the third and fourth board ground patterns GND6 and GND7.

The first to fourth board ground patterns GND4, GND5, GND6, and GND7 are separated from each other and are not electrically connected to each other on the filter board P. The first board ground pattern GND4 is connected to the ground plane G by the first connection member SC1 such as a screw, the second board ground pattern GND5 is connected to the ground plane G by the second connection member SC2 such as a screw, the third board ground pattern GND6 is connected to the ground plane G by the third connection member SC3 such as a screw, and the fourth board ground pattern GND7 is connected to the ground plane G by the fourth connection member SC4 such as a screw. Accordingly, the first to fourth board ground patterns GND4, GND5, GND6, and GND7 are electrically connected to each other via the first to fourth connection members SC1, SC2, SC3, and SC4 and the ground plane G. The ground plane G is connected to a structure (such as the chassis or cabinet of a vehicle) kept at the ground potential. In addition, the first to fourth board ground patterns GND4, GND5, GND6, and GND7 are solid patterns. The first board ground pattern GND4 and the second board ground pattern GND5 adjacent to each other, the first board ground pattern GND4 and the third board ground pattern GND6 adjacent to each other, the third board ground pattern GND6 and the fourth board ground pattern GND7 adjacent to each other, and the second board ground pattern GND5 and the fourth board ground pattern GND7 adjacent to each other are disposed so as to have a spacing less than one-half of the wavelength of a predetermined electromagnetic wave and equal to or less than a predetermined distance. In addition, the filter board P is a multilayer board including the first to fourth board ground patterns GND4, GND5, GND6, and GND7 on an outer layer and the main circuit pattern on an inner layer.

The first line bypass capacitor C1 is disposed on the first board ground pattern GND4 and the second line bypass capacitor C2 is disposed on the second board ground pattern GND5, the third line bypass capacitor C3 is disposed on the third board ground pattern GND6, and the fourth line bypass capacitor C4 is disposed on the fourth board ground pattern GND7.

In the noise filter NF3 illustrated in FIG. 14, the lower left side in FIG. 14 is connected to the input side main circuit pattern on the input side (the power source side) and the upper right side is connected to the load side main circuit pattern on the load side (the electric equipment side).

Figure 15:
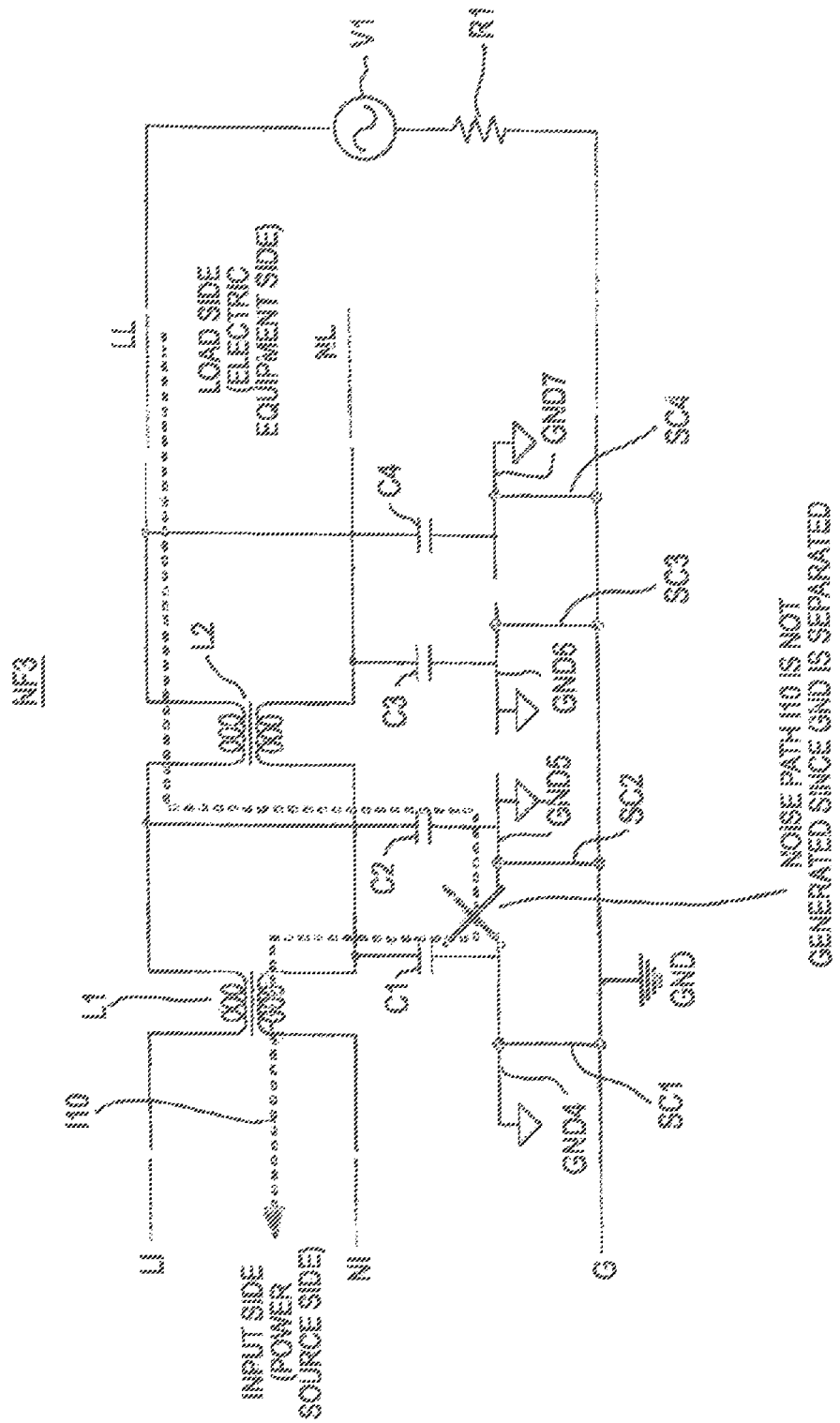
FIG. 15 is an equivalent circuit diagram used to describe the operation of the noise filter according to embodiment 3 of the invention.

FIG. 15 is an equivalent circuit diagram used to describe the operation of the noise filter according to embodiment 3 of the invention. In FIG. 15, a noise filter NF3 according to embodiment 3 of the invention has an input side connected to the input side main circuit patterns LI and NI and a load side connected to the load side main circuit patterns LL and NL. The first common mode choke coil L1 and the second common mode choke coil L2 are connected in series between the input side and the load side of the noise filter NF3. The input side main circuit pattern LI and the load side main circuit pattern LL are connected to each other via the first and second common mode choke coils L1 and L2 and the input side main circuit pattern NI and the load side main circuit pattern NL are connected to each other via the first and second common mode choke coils L1 and L2.

The first line bypass capacitor C1 is connected between one interconnection section NC of the first and second common mode choke coils L1 and L2 and the first board ground pattern GND4. The second line bypass capacitor C2 is connected between the other interconnection section LC of the first and second common mode choke coils L1 and L2 and the second board ground pattern GND5. The third line bypass capacitor C3 is connected between the load side main circuit pattern NL and the third board ground pattern GND6. The fourth line bypass capacitor C4 is connected between the load side main circuit pattern LL and the fourth board ground pattern GND7.

The first and second line bypass capacitors C1 and C2 are disposed on the load side of the first common mode choke coil L1 and the third and fourth line bypass capacitors C3 and C4 are disposed on the load side of the second common mode choke coil L2. In this case, it is assumed that the noise source is disposed on the load side of the main circuit. When it is assumed that the noise source is disposed on the input side of the main circuit, the first and second line bypass capacitors C1 and C2 are disposed on the input side of the first common mode choke coil L1 and the third and fourth line bypass capacitors C3 and C4 are disposed on the input side of the second common mode choke coil L2.

As illustrated in FIG. 14, in the noise filter NF3 according to embodiment 3 of the invention, the board ground pattern is separated into the first to fourth board ground patterns GND4, GND5, GND6, and GND7 so as to correspond to the first to fourth line bypass capacitors C1, C2, C3, and C4, respectively. This provides the effects described in embodiment 2 above and prevents the formation of, for example, a tenth noise current path I10 leading to the input side main circuit via the second line bypass capacitor C2, the board ground pattern, the first line bypass capacitor C1, and the first common choke coil L1 and prevents degradation of noise attenuation characteristics.

Suppression of degradation of noise attenuation characteristics due to conducted noise has been described above. Next, suppression of degradation of noise attenuation characteristics due to radiation noise will be described.

When a noise source is present in the vicinity of the noise filter NF3 as in the above embodiments, noise is mixed into the main circuit pattern of the filter board P from the noise source via the air (not illustrated). To prevent this, by forming the first to fourth board ground patterns GND4, GND5, GND6, and GND7 as surface layer patterns and forming these patterns as solid patterns, mixture of noise into the main circuit pattern is suppressed since radiation noise is grounded to the ground plane G via the first to fourth board ground patterns GND4, GND5, GND6, and GND7, which are surface layers. In addition, as described above, the board ground patterns adjacent to each other are disposed so as to have a spacing equal to or less than a predetermined distance to prevent radiation noise with a predetermined frequency or less from being mixed into the main circuit pattern.

Although the noise filter according to embodiment 3 of the invention is assumed to have two stages of filter circuits including coils and capacitors, the invention is not limited to embodiment 3 and may have three or more stages of filter circuits.

Embodiment 4

Figure 16:
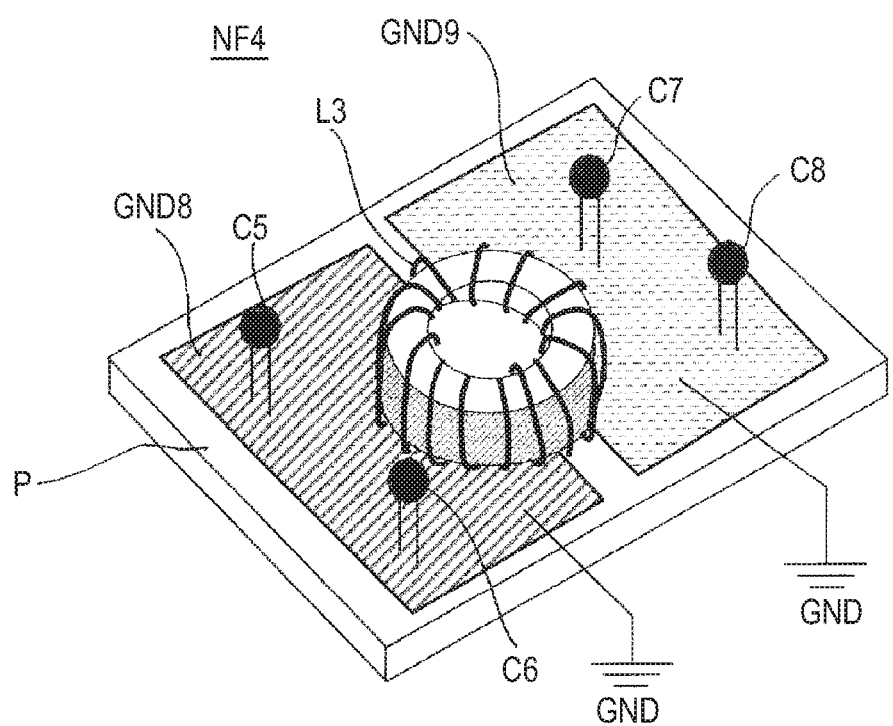
FIG. 16 is a perspective view schematically illustrating a noise filter according to embodiment 4 of the invention.

Next, a noise filter according to embodiment 4 of the invention will be described. FIG. 16 is a perspective view schematically illustrating a noise filter according to embodiment 4 of the invention. As illustrated in FIG. 16, a noise filter according to embodiment 4 of the invention includes one common mode choke coil L3 on the filter board P, the first and second line bypass capacitors C5 and C6 disposed on the input side of the common mode choke coil L3, and the third and fourth line bypass capacitors C7 and C8 disposed on the load side of the common mode choke coil L3.

In addition, as illustrated in FIG. 16, the first board ground pattern GND8 and the second board ground pattern GND9 separated from each other are formed on the filter board P. The common mode choke coil L3 is disposed over the first board ground pattern GND8 and the second board ground pattern GND9. In addition, the first and second line bypass capacitors C5 and C6 are disposed on the first board ground pattern GND8 and the third and fourth line bypass capacitors C7 and C8 are disposed on the second board ground pattern GND9. In addition, the first and second board ground patterns GND8 and GND9 are formed as solid patterns and the first and second board ground patterns GND8 and GND9 adjacent to each other are disposed so as to have a spacing less than one-half of the wavelength of a predetermined electromagnetic wave and equal to or less than a predetermined distance. The filter board P is a multilayer board including the board ground pattern on an outer layer and the main circuit pattern on an inner layer.

In the noise filter NF4 illustrated in FIG. 16, the lower left side in FIG. 16 is connected to the input side main circuit pattern on the input side (the power source side) and the upper right side is connected to the load side main circuit pattern on the load side (the electric equipment side).

Figure 17:
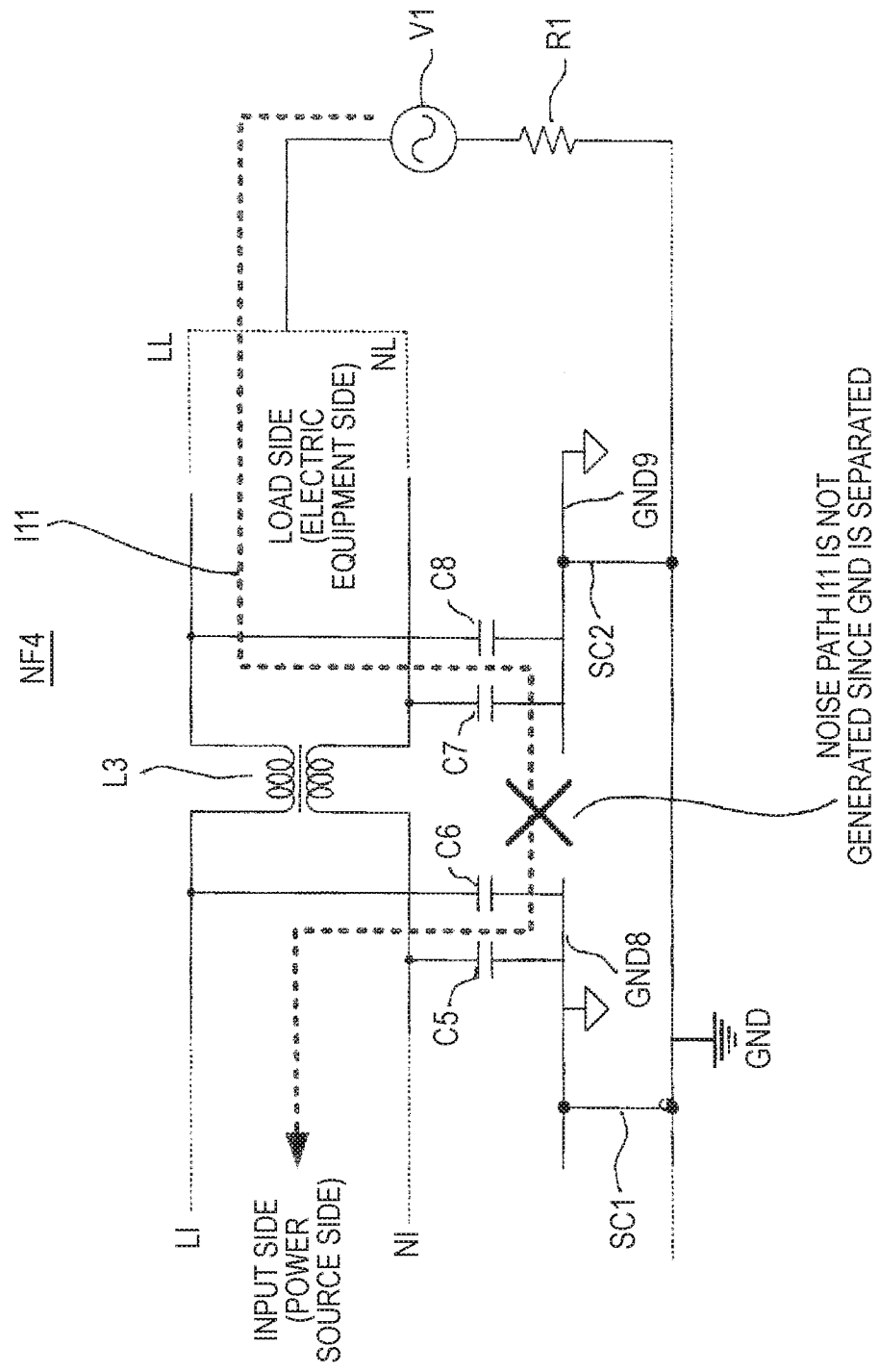
FIG. 17 is an equivalent circuit diagram used to describe the operation of the noise filter according to embodiment 4 of the invention.

FIG. 17 is an equivalent circuit diagram used to describe the operation of the noise filter according to embodiment 4 of the invention. In FIG. 17, the noise filter NF4 according to embodiment 4 of the invention has an input side connected to the input side main circuit patterns LI and NI and a load side connected to the load side main circuit patterns LL and NL. The input side main circuit pattern LI and the load side main circuit pattern LL are connected to each other via the common mode choke coil L3 and the input side main circuit pattern NI and the load side main circuit pattern NL are connected to each other via the common mode choke coil L3.

The first line bypass capacitor C5 is connected between the input side main circuit pattern NI and the first board ground pattern GND8 on the input side of the common mode choke coil L3. The second line bypass capacitor C6 is connected between the input side main circuit pattern LI and the first board ground pattern GND8 on the input side of the common mode choke coil L3. The third line bypass capacitor C7 is connected between the load side main circuit pattern NL and the second board ground pattern GND9 on the load side of the common mode choke coil L3. The fourth line bypass capacitor C8 is connected between the load side main circuit pattern LL and the second board ground pattern GND9 on the load side of the common mode choke coil L3.

In the noise filter NF4 according to embodiment 4 of the invention, as illustrated in FIG. 17, the board ground pattern is separated into the first and second board ground patterns GND8 and GND9 so as to correspond to the first and second line bypass capacitors C5 and C6 and the third and fourth line bypass capacitors C7 and C8, respectively. This prevents the formation of a noise current path I11 leading to the input side main circuit pattern via the second and third line bypass capacitors C7 and C8, the board ground pattern, and the first and second line bypass capacitors C5 and C6 and prevents the noise current generated by the noise source V1 from flowing to the input side main circuit and the noise attenuation characteristics from degrading.

Suppression of degradation of noise attenuation characteristics due to conducted noise has been described above. Next, suppression of degradation of noise attenuation characteristics due to radiation noise will be described.

When a noise source is present in the vicinity of the noise filter NF4 as in the above embodiments, noise is mixed into the main circuit pattern of the filter board P from the noise source via the air (not illustrated). To prevent this, by forming the board ground patterns GND8 and GND9 as the surface layer patterns and forming these patterns as solid patterns, mixture of noise into the main circuit pattern is suppressed since radiation noise is grounded to the ground plane G via the first and second board ground patterns GND8 and GND9 on a surface layer. In addition, the first and second board ground patterns (GND8 and GND9) adjacent to each other are disposed so as to have a spacing equal to or less than a predetermined distance to prevent radiation noise with a predetermined frequency or less from being mixed into the main circuit pattern.

Embodiment 5

Figure 18:
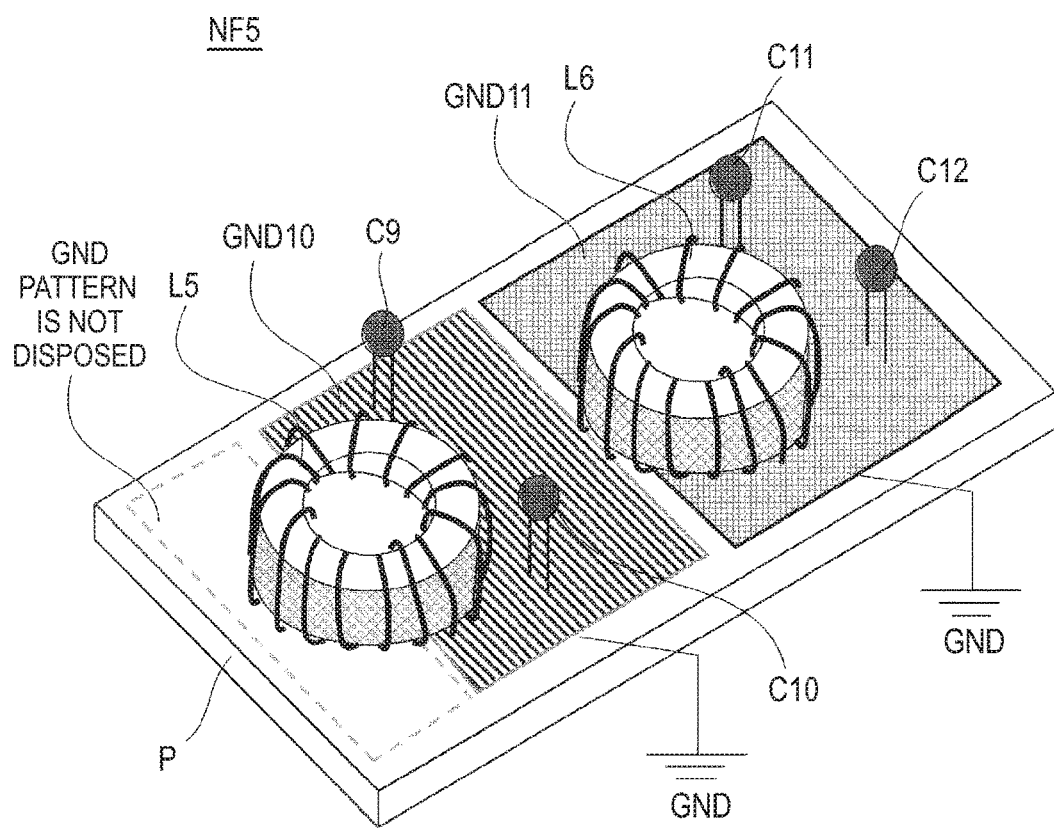
FIG. 18 is a perspective view schematically illustrating a noise filter according to embodiment 5 of the invention.

Next, a noise filter according to embodiment 5 of the invention will be described. FIG. 18 is a perspective view schematically illustrating a noise filter according to embodiment 5 of the invention. As illustrated in FIG. 18, a noise filter NF5 according to embodiment 5 of the invention has the first and second common mode choke coils L5 and L6, the first to fourth line bypass capacitors C9, C10, C11, and C12, and the first and second board ground patterns GND10 and GND11 on the filter board P. The filter circuit F1 including the first choke coil L5 and the first and second line bypass capacitors C9 and C10 is referred to as the first filter circuit F1 and the filter circuit including the first choke coil L6 and the third and fourth line bypass capacitors C11 and C12 is referred to as the second filter circuit F2. The line bypass capacitors C9, C10, C11, and C12 of the filter circuits F1 and F2 are connected to the load sides of the common mode choke coils L5 and L6.

The first board ground pattern GND10 and the second board ground pattern GND11 are separately provided so as to correspond to the first filter circuit F1 and the second filter circuit F2, respectively, and the first board ground pattern GND10 and the second board ground pattern GND11 are not electrically connected to each other on the filter board P. The first board ground pattern GND10 is connected to the ground plane G by the first connection member SC1 such as a screw and the second board ground pattern GND11 is connected to the ground plane G by the second connection member SC2 such as a screw. Accordingly, the first board ground pattern GND10 and the second board ground pattern GND11 are electrically connected to each other via the first and second connection members SC1 and SC2 and the ground plane G. The ground plane G is connected to a structure (such as the chassis or cabinet of a vehicle) kept at the ground potential. In addition, the first and second board ground patterns GND10 and GND11 are solid patterns. The first and second board ground patterns GND10 and GND11 adjacent to each other are disposed so as to have a spacing less than one-half of the wavelength of a predetermined electromagnetic wave and equal to or less than a predetermined distance. In addition, the filter board P is a multilayer board including the board ground pattern on an outer layer and the main circuit pattern on an inner layer.

The filter board P has an area Z in which no board ground pattern is disposed. This area Z in which no board ground pattern is disposed is formed by removing a part of the first board ground pattern GND10. The first common mode choke coil L5 is disposed over the first board ground pattern GND10 and the area Z in which no board ground pattern is disposed. The main circuit patterns L1 and N1 from the input power source side to the first choke coil L5, which will be described later, are disposed over the area Z of the filter board P in which no board ground pattern is disposed and the first board ground pattern GND10 of the filter board P is disposed so as not to overlap with the main circuit patterns LI and NI.

In the noise filter NF5 illustrated in FIG. 18, the lower left side in FIG. 18 is connected to the input side main circuit pattern on the input side (the power source side) and the upper right side is connected to the load side main circuit pattern on the load side (the electric equipment side).

Figure 19:
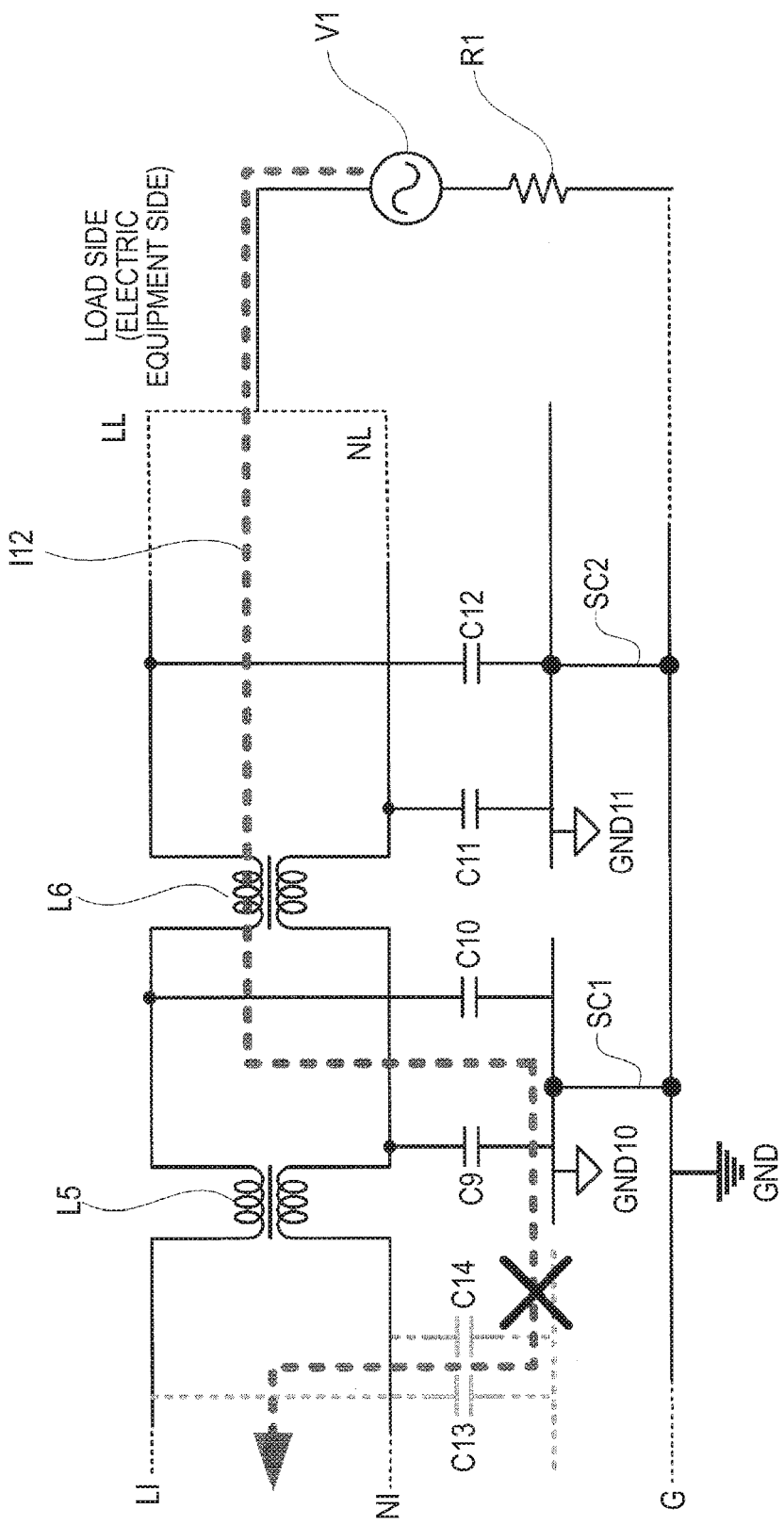
FIG. 19 is an equivalent circuit diagram used to describe the operation of the noise filter according to embodiment 5 of the invention.

FIG. 19 is an equivalent circuit diagram used to describe the operation of the noise filter according to embodiment 5 of the invention and the current path of noise current. In FIG. 19, the noise filter NF5 according to embodiment 5 of the invention has an input side connected to the input side main circuit patterns LI and NI and a load side connected to the load side main circuit patterns LL and NL. The input side main circuit pattern LI and the load side main circuit pattern LL are connected to each other via the first and second common mode choke coils L5 and L6 and the input side main circuit pattern NI and the load side main circuit pattern NL are connected to each other via the first and second common mode choke coils L5 and L6. As described above, the main circuit patterns L1 and N1 from the input power source side to the first choke coil L5 are disposed in an area Z of the filter board P in which no board ground pattern is disposed and the first board ground pattern GND10 of the filter board P is disposed so as not to overlap with the main circuit patterns LI and NI.

The first line bypass capacitor C9 is connected between one interconnection section NC of the first and second common mode choke coils L5 and L6 and the first board ground pattern GND10. The second line bypass capacitor C10 is connected between the other interconnection section LC of the first and second common mode choke coils L5 and L6 and the first board ground pattern GND10. The third line bypass capacitor C11 is connected between the load side main circuit pattern NL and the second board ground pattern GND11. The fourth line bypass capacitor C12 is connected between the load side main circuit pattern LL and the second board ground pattern GND11.

To understand the operation of the noise filter according to embodiment 5 of the invention, the case in which the board ground pattern GND10 overlaps with the part of the main circuit pattern from the input side to the filter circuit 2 is taken as a comparative example. In this case, since a connection member such as a screw has an impedance, the intrinsic impedance is present between the common board ground pattern GND3 and the ground plane G. Next, in the part of the board ground pattern 10 that overlaps with the part of the main circuit pattern from the input side to the first common mode choke coil L5, first stray capacitance C13 and second stray capacitance C14 are present between the patterns. Accordingly, as indicated by the dashed arrow in FIG. 19, a part of noise current generated from the noise source V1 flows through a twelfth current path I12 leading to the input side via the second common mode choke coil L6 of the second filter circuit F2, the first and second line bypass capacitors C9 and C10, GND10, and the first and second stray capacitances C13 and C14 and flows to the power source side of the main circuit. This causes degradation of the noise attenuation characteristics of the noise filter in a high frequency band.

The operation of the noise filter according to embodiment 5 of the invention will be described. The first board ground pattern GND10 is disposed so as not to overlap with the part of the main circuit patterns LI and NI from the input power source side to the first choke coil L5 in FIG. 19 as described above, so the first stray capacitance C13 and second stray capacitance C14 are not present, the noise current path I12 described above is not formed, and the noise current generated from the noise source V1 returns from the first and second connection members SC1 and SC2 to the noise source V1 via the ground plane G. Accordingly, the noise current generated from the noise source V1 does not flow to the input side main circuit, thereby preventing the degradation of noise attenuation characteristics.

Although line bypass capacitors are formed by capacitor components in the above embodiments, the invention is not limited to the embodiments and line bypass capacitors may be formed by stray capacitance components between a board ground pattern and a common mode choke coil.

In addition, the structure of the noise filter according to embodiment 3 in which the board ground pattern is separated for each line bypass capacitor is applicable to other embodiments.

In addition, the embodiments of the invention may be combined arbitrarily or may be modified or omitted as appropriate within the scope of the invention.

The above noise filter according to the invention is characterized by the following structure.

(1) A noise filter including a board, at least one coil mounted on the board, a board ground pattern formed on the board, and at least one capacitor mounted on the board, the at least one capacitor being connected between the at least one coil and the board ground pattern, the noise filter being inserted between a power source side and a load side of a main circuit for which noise is attenuated, the noise filter attenuating the noise of the main circuit using a filter circuit including the at least one coil and the at least one capacitor, in which the board ground pattern is separated into a plurality of board ground patterns, the separated board ground patterns are connected to a common ground member present outside the board, and the separated board ground patterns are formed as solid patterns and adjacent board ground patterns of the separated board ground patterns are disposed so as to have a spacing equal to or less than a predetermined distance.

(2) The noise filter according to (1), in which the at least one capacitor includes a capacitor disposed on the power source side of the coil and a capacitor disposed on the load side of the coil, the filter circuit includes the plurality of capacitors and the coil, and the board ground pattern is separated between the capacitor disposed on the power source side of the coil and the capacitor disposed on the load side of the coil.

(3) The noise filter according to (1) or (2), in which the at least one coil includes a plurality of coils.

(4) The noise filter according to (1), in which the at least one coil includes a plurality of coils, the at least one capacitor includes a capacitor disposed on the power source side of the coil and a capacitor disposed on the load side of the coil, the filter circuit includes the capacitors and at least one of the coils, and the board ground pattern is separated for each of the capacitors.

(5) The noise filter according to (1), in which the main circuit includes a positive side line and a negative side line, the at least one capacitor includes a capacitor connected to the positive side line and a capacitor connected to the negative side line, and the board ground pattern is separated between the capacitor connected to the positive side line and the capacitor connected to the negative side line.

(6) The noise filter according to (1), in which the filter circuit includes a plurality of filter blocks each having the at least one coil and the at least one capacitor, and the board ground pattern is separated for each of the filter blocks.

(7) The noise filter according to (1), in which the at least one capacitor includes a capacitor disposed on the power source side of the coil and a capacitor disposed on the load side of the coil, the board ground pattern is separated into a board ground pattern on the power source side of the coil and a board ground pattern on the load side of the coil, the capacitor disposed on the power source side is connected to the separated board ground pattern on the power source side, and the capacitor disposed on the load side is connected to the separated board ground pattern on the load side.

(8) The noise filter according to (6), in which the at least one capacitor of the filter block is disposed on the load side of the at least one coil of the filter block and the board ground pattern is disposed so as not to overlap with a part of the main circuit from the power source side to the coil closest to the power source side.

(9) The noise filter according to any one of (1) to (8), in which the board is configured by a multilayer board, the board ground pattern is disposed on an outer layer of the board, and a pattern of the main circuit is disposed on an inner layer of the board.

INDUSTRIAL APPLICABILITY

The present invention is applicable to the field of electric equipment such as an AC-DC converter and inverter and the field of a vehicle such as an automobile in which such electric equipment is installed.

The invention claimed is:

1. A noise filter comprising:
a board;
at least one coil mounted on the board;
a board ground pattern formed on the board; and
at least one capacitor mounted on the board, the at least one capacitor being connected between the at least one coil and the board ground pattern, the noise filter being inserted between a power source side and a load side of a main circuit, the noise filter attenuating noise of the main circuit using a filter circuit including the at least one coil and the at least one capacitor,
wherein the board ground pattern is separated into a plurality of board ground patterns,
the separated plurality of board ground patterns are connected to a common ground member present outside the board, and
the separated plurality of board ground patterns are formed as solid patterns on a same surface of the board and a distance between two adjacent board ground patterns of the separated plurality of board ground patterns on the same surface is less than or equal to one half of an operating wavelength of the noise filter, the two adjacent board ground patterns are physically and entirely separated from each other and are connected to the at least one coil, the at least one coil being disposed between the two adjacent board ground patterns.

2. The noise filter according to claim 1,
wherein the at least one capacitor includes a first capacitor disposed on the power source side of the main circuit and a second capacitor disposed on the load side of the main circuit,
the filter circuit includes the first and second capacitors and the at least one coil, and
the board ground pattern is separated between the first capacitor disposed on the power source side of the main circuit and the second capacitor disposed on the load side of the main circuit.

3. The noise filter according to claim 1,
wherein the at least one coil includes a plurality of coils.

4. The noise filter according to claim 1,
wherein the at least one coil includes a plurality of coils,
the at least one capacitor includes a first capacitor disposed on the power source side of the main circuit and a second capacitor disposed on the load side of the main circuit,
the filter circuit includes the first and second capacitors and at least one of the plurality of coils, and
the board ground pattern is separated for each of the first and second capacitors.

5. The noise filter according to claim 1,
wherein the main circuit includes a positive side line and a negative side line, the at least one capacitor includes a first capacitor connected to the positive side line and a second capacitor connected to the negative side line, and the board ground pattern is separated between the first capacitor connected to the positive side line and the second capacitor connected to the negative side line.

6. The noise filter according to claim 1, wherein the filter circuit includes a plurality of filter blocks each having the at least one coil and the at least one capacitor, and the board ground pattern is separated to correspond to each of the plurality of filter blocks.

7. The noise filter according to claim 6, wherein the at least one capacitor of one of the plurality of filter blocks is disposed on the load side of the main circuit, and the board ground pattern is disposed so as not to overlap with the power source side of the main circuit and the at least one coil closest to the power source side among a plurality of coils including the at least one coil.

8. The noise filter according to claim 1, wherein the at least one capacitor includes a first capacitor disposed on the power source side of the main circuit and a second capacitor disposed on the load side of the main circuit, the separated plurality of board ground patterns include a first board ground pattern disposed on the power source side of the main circuit and a second board ground pattern disposed on the load side of the main circuit, the first capacitor disposed on the power source side is connected to the first board ground pattern on the power source side, and the second capacitor disposed on the load side is connected to the second board ground pattern on the load side.

9. The noise filter according to claim 1, wherein the board is configured by a multilayer board, the board ground pattern is disposed on an outer layer of the board, and a pattern of the main circuit is disposed on an inner layer of the board.

* * * * *